US006279505B1

(12) United States Patent
Plester et al.

(10) Patent No.: US 6,279,505 B1
(45) Date of Patent: *Aug. 28, 2001

(54) PLASTIC CONTAINERS WITH AN EXTERNAL GAS BARRIER COATING

(75) Inventors: George Plester, Brussels (BE); Horst Ehrich, Dorsten (DE); Mark Rule, Atlanta, GA (US); Herbert Pickel, Neutraubling; Heinz Humele, Thalmassing, both of (DE)

(73) Assignee: THe Coca-Cola Company, Atlanta, GA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/380,904

(22) PCT Filed: Mar. 13, 1998

(86) PCT No.: PCT/US98/05293

§ 371 Date: Sep. 10, 1999

§ 102(e) Date: Sep. 10, 1999

(87) PCT Pub. No.: WO98/40531

PCT Pub. Date: Sep. 17, 1998

Related U.S. Application Data

(63) Continuation-in-part of application No. 08/818,342, filed on Mar. 14, 1997.

(51) Int. Cl.[7] ................................................ C23C 16/00
(52) U.S. Cl. .................. 118/723 VE; 118/723 R; 118/718; 118/719; 118/729
(58) Field of Search .................. 118/723 VE, 723 R, 118/729, 718, 719; 204/298.25

(56) References Cited

U.S. PATENT DOCUMENTS 2,664,852   1/1954   Chadsey, Jr. ........................... 118/49

| 2,665,226 | 1/1954 | Godley, 2nd et al. ................ 117/107 |
| 2,996,037 | 8/1961 | Eng ......................................... 118/49 |
| 3,016,873 | 1/1962 | Baer et al. ............................ 118/49.1 |
| 3,511,703 | 5/1970 | Peterson . |
| 3,625,848 | 12/1971 | Snaper . |
| 4,230,068 | 10/1980 | Itoh et al. . |
| 4,438,368 | 3/1984 | Abe et al. . |

(List continued on next page.)

FOREIGN PATENT DOCUMENTS

| 1521421 | 12/1969 | (DE) . |
| 3239131 | 4/1984 | (DE) . |
| 40 26 494 C2 | 5/1992 | (DE) . |

(List continued on next page.)

OTHER PUBLICATIONS

G.I. Deak and S.C. Jackson; *Mylar Polyester Films with Inorganic Glass Coatings*; Du Pont Company, Wilmington, DE, pp. 318–323.

*Primary Examiner*—Jeffrie R. Lund
(74) *Attorney, Agent, or Firm*—Sutherland Asbill & Brennan, LLP

(57) ABSTRACT

A coated plastic container provides for low permeability to gases and vapors. A method and system for coating plastic containers includes applying a thin inorganic oxide layer to the external surface of the containers with plasma-assisted vacuum vapor deposition. For example, the coating can include silica which is bonded to the external surface of the container. This coating is flexible and be can be applied regardless of the container's internal pressure or lack thereof. The coating firmly adheres to the container and possess an enhanced gas barrier effect after pressurization even when the coating is scratched, fractured, flexed and/or stretched. Moreover, this gas barrier enhancement will be substantially unaffected by filling of the container. A method of recycling coated plastic containers and a method and system for packaging a beverage using the coated containers are also disclosed.

16 Claims, 20 Drawing Sheets

U.S. PATENT DOCUMENTS

| | | |
|---|---|---|
| 4,448,802 | 5/1984 | Buhl et al. . |
| 4,532,150 | 7/1985 | Endo et al. . |
| 4,532,196 | 7/1985 | Yasui et al. . |
| 4,552,791 | 11/1985 | Hahn . |
| 4,573,429 | 3/1986 | Cobbs, Jr. et al. . |
| 4,615,916 | 10/1986 | Henderson . |
| 4,634,605 | 1/1987 | Wiesmann . |
| 4,697,974 | 10/1987 | Eltoukhy . |
| 4,752,426 | 6/1988 | Cho . |
| 4,765,273 | 8/1988 | Anderle . |
| 4,824,545 | 4/1989 | Arnold et al. . |
| 4,849,088 | 7/1989 | Veltrop et al. . |
| 4,888,199 | 12/1989 | Felts et al. . |
| 4,902,531 | 2/1990 | Nakayama et al. . |
| 4,917,786 | 4/1990 | Ehrich . |
| 4,919,968 | 4/1990 | Buhl et al. . |
| 4,975,168 | 12/1990 | Ohno et al. . |
| 5,084,356 | 1/1992 | Deak et al. . |
| 5,085,904 | 2/1992 | Deak et al. . |
| 5,091,210 | 2/1992 | Mikoshiba et al. . |
| 5,096,558 | 3/1992 | Ehrich . |
| 5,112,644 | 5/1992 | Seddon et al. . |
| 5,215,640 | 6/1993 | Buhl et al. . |
| 5,250,328 | 10/1993 | Otto . |
| 5,308,649 | 5/1994 | Babacz . |
| 5,308,950 | 5/1994 | Ramm et al. .............. 219/121.43 |
| 5,364,666 | 11/1994 | Williams et al. . |
| 5,374,314 | 12/1994 | Babacz . |
| 5,378,510 | 1/1995 | Thomas et al. . |
| 5,387,326 | 2/1995 | Buhl et al. . |
| 5,429,729 | 7/1995 | Kamei et al. . |
| 5,437,895 | 8/1995 | Kodama et al. . |
| 5,462,779 | 10/1995 | Misiano et al. . |
| 5,468,520 | 11/1995 | Williams et al. . |
| 5,510,155 | 4/1996 | Williams et al. . |
| 5,521,351 | 5/1996 | Mahoney . |
| 5,531,060 | 7/1996 | Fayet et al. . |
| 5,558,720 | 9/1996 | Sarraf et al. ..................... 118/726 |
| 5,565,248 | 10/1996 | Plester et al. . |
| 5,616,369 | 4/1997 | Williams et al. . |
| 5,651,867 | 7/1997 | Kokaku et al. . |
| 5,662,741 | 9/1997 | Ehrich . |
| 5,670,224 | 9/1997 | Izu et al. . |
| 5,677,010 | 10/1997 | Esser et al. . |
| 5,691,007 | 11/1997 | Montgomery . |
| 5,704,983 | 1/1998 | Thomas et al. . |
| 6,132,562 * | 10/2000 | Baumecker et al. ............ 204/192.12 |

FOREIGN PATENT DOCUMENTS

| | | |
|---|---|---|
| 42 03 371 C1 | 2/1993 | (DE) . |
| 40 06 457 C2 | 9/1993 | (DE) . |
| 4305721 | 7/1994 | (DE) . |
| 4343042 | 3/1995 | (DE) . |
| 4412906 | 7/1995 | (DE) . |
| 196 00 993 A1 | 8/1996 | (DE) . |
| 44 44 763 C2 | 11/1996 | (DE) . |
| 195 46 827 A1 | 6/1997 | (DE) . |
| 0 460 796 A2 | 4/1991 | (EP) . |
| 0 460 796 B1 | 4/1991 | (EP) . |
| 0 535 810 A1 | 9/1992 | (EP) . |
| 0 438 627 B1 | 5/1995 | (EP) . |
| 0785291 | 7/1997 | (EP) . |
| 0 550 039 B1 | 3/1998 | (EP) . |
| 2 139 647 A | 11/1984 | (GB) . |
| 2 263 472 A | 1/1992 | (GB) . |
| 57169088 | 10/1982 | (JP) . |
| 61104075 | 5/1986 | (JP) . |
| 63243264 | 10/1988 | (JP) . |
| 63312968 | 12/1988 | (JP) . |
| 02118064 | 5/1990 | (JP) . |
| 08092764 | 4/1996 | (JP) . |
| WO 92/03841 | 3/1992 | (WO) . |
| WO 92-12275 | 7/1992 | (WO) . |

* cited by examiner

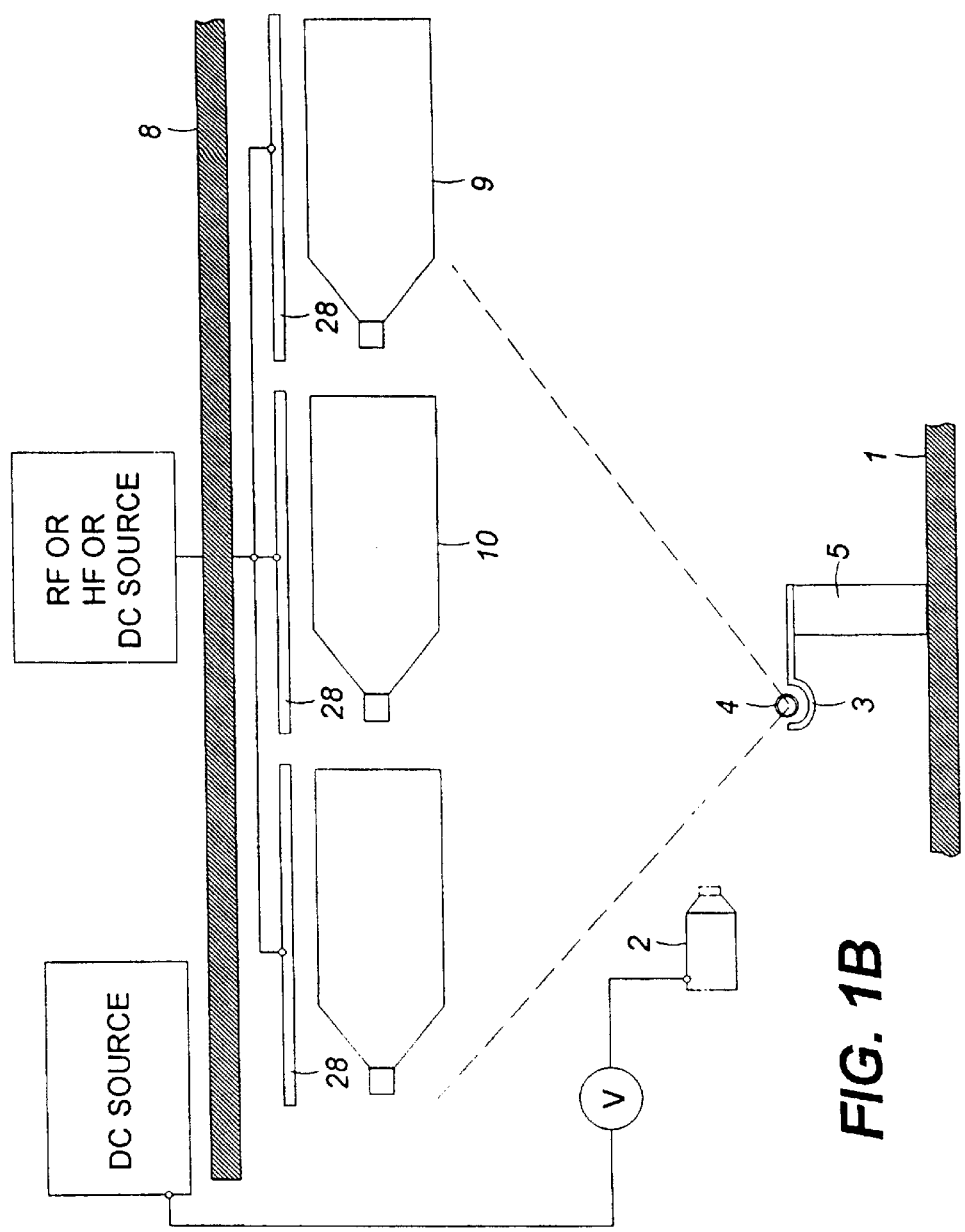
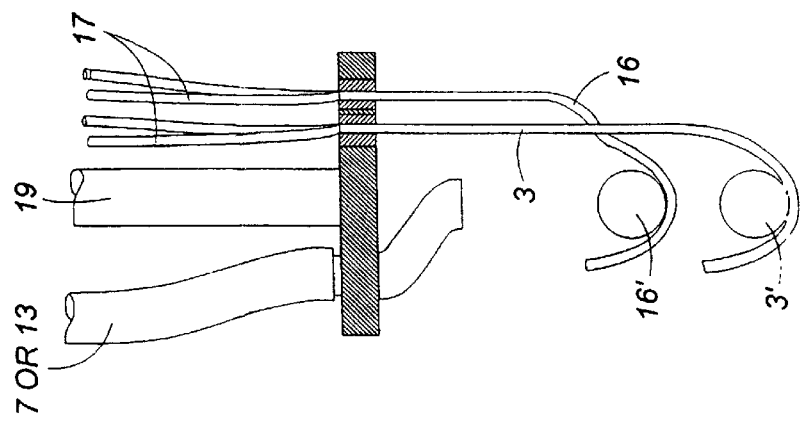
FIG. 1B
FIG. 1A

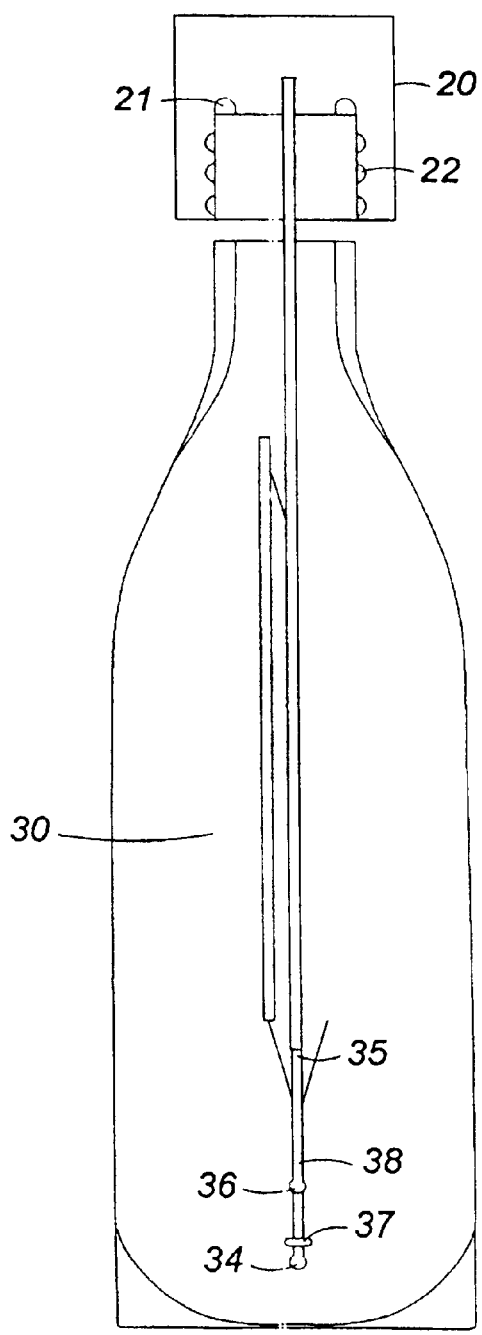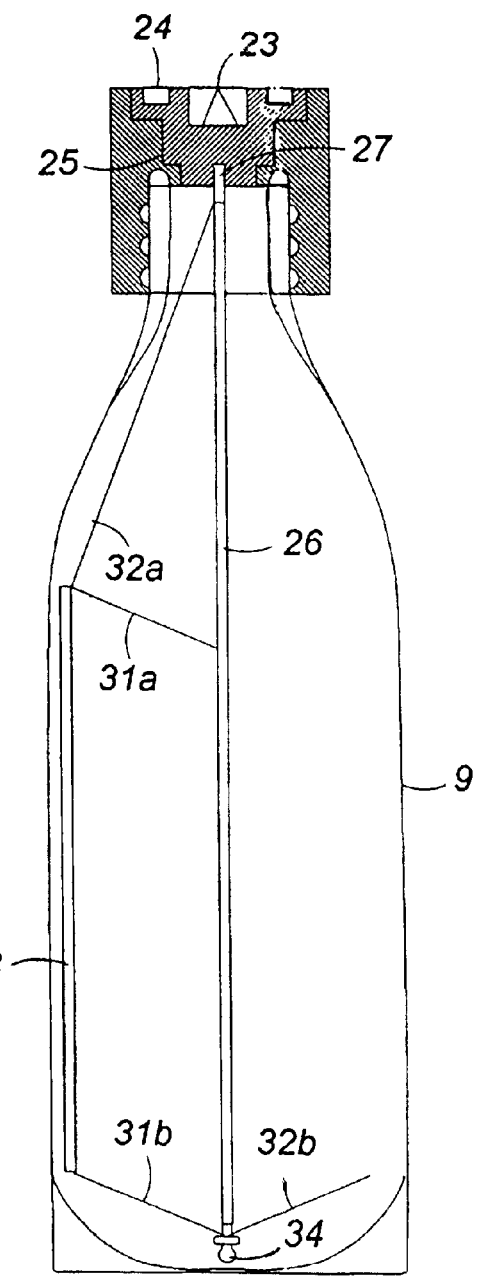
FIG. 2A     FIG. 2B

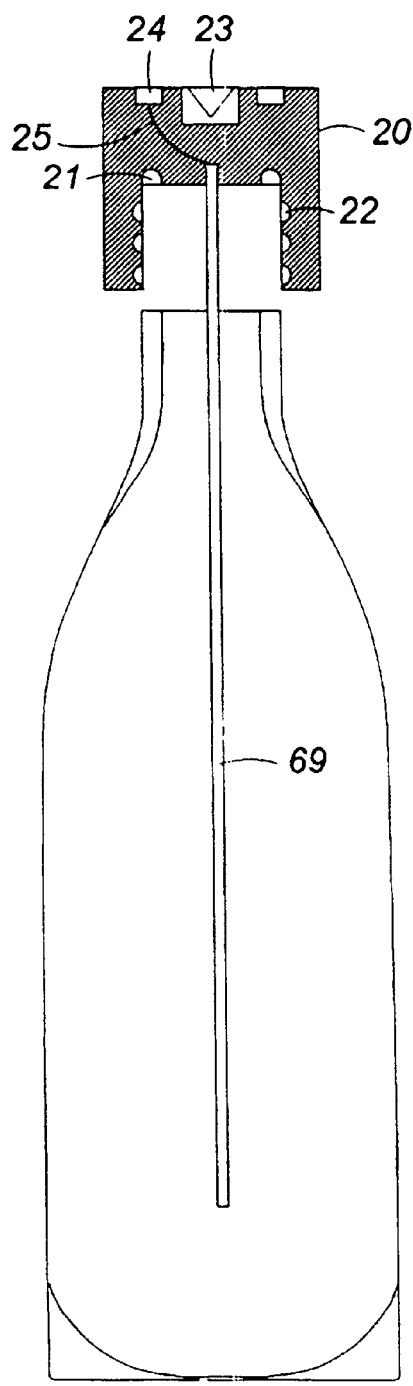
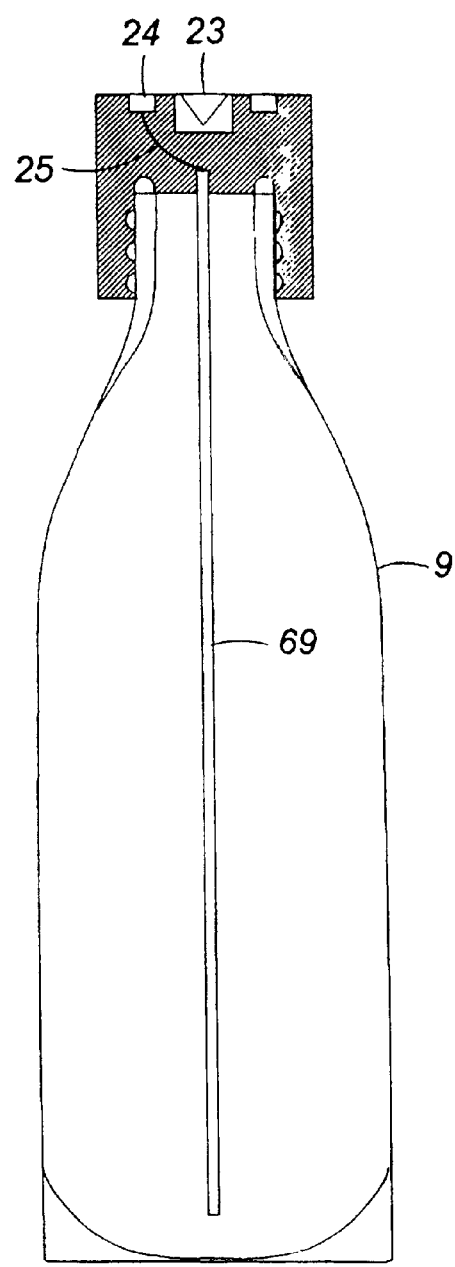
FIG. 2C　　　　FIG. 2D

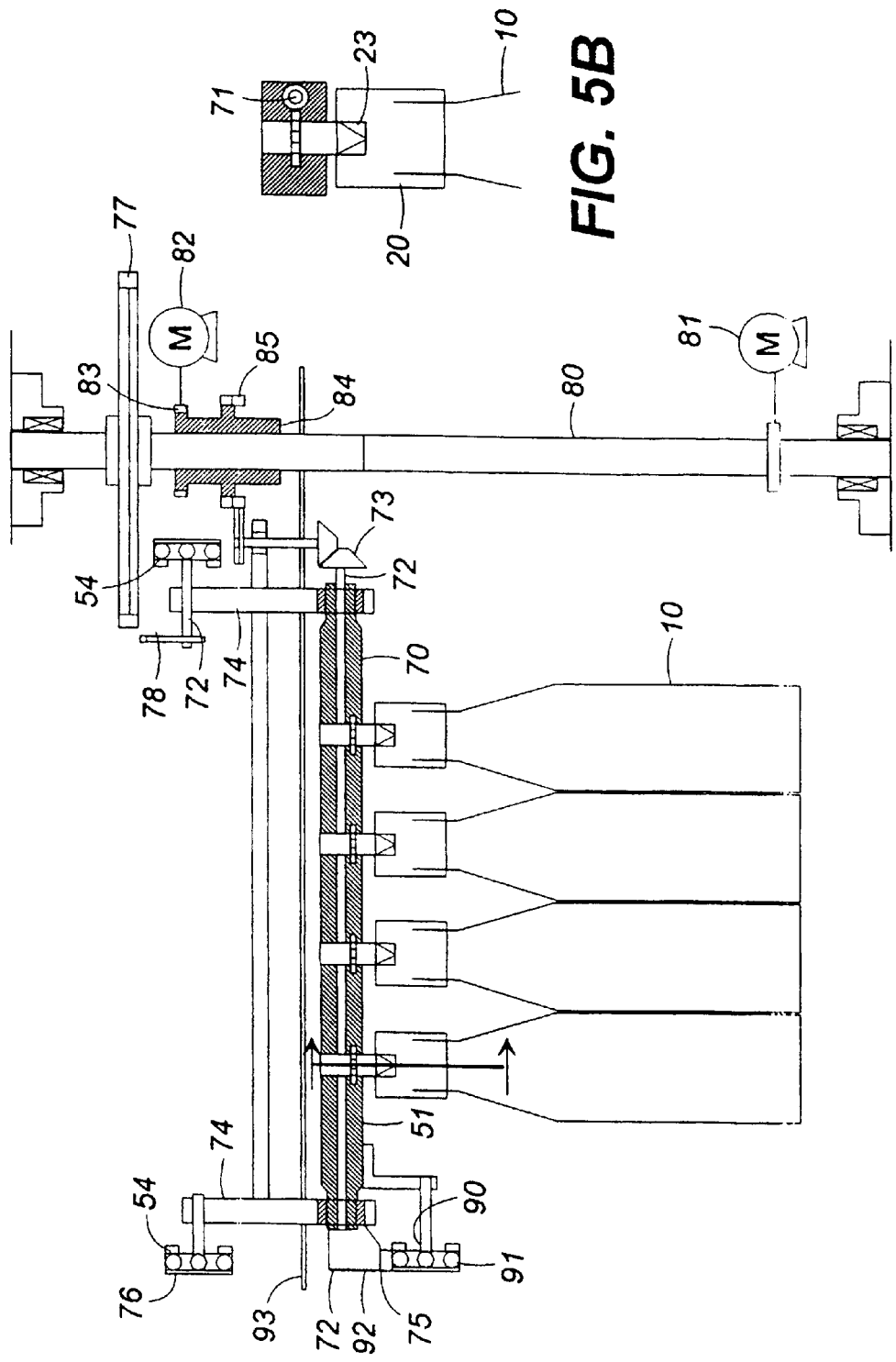

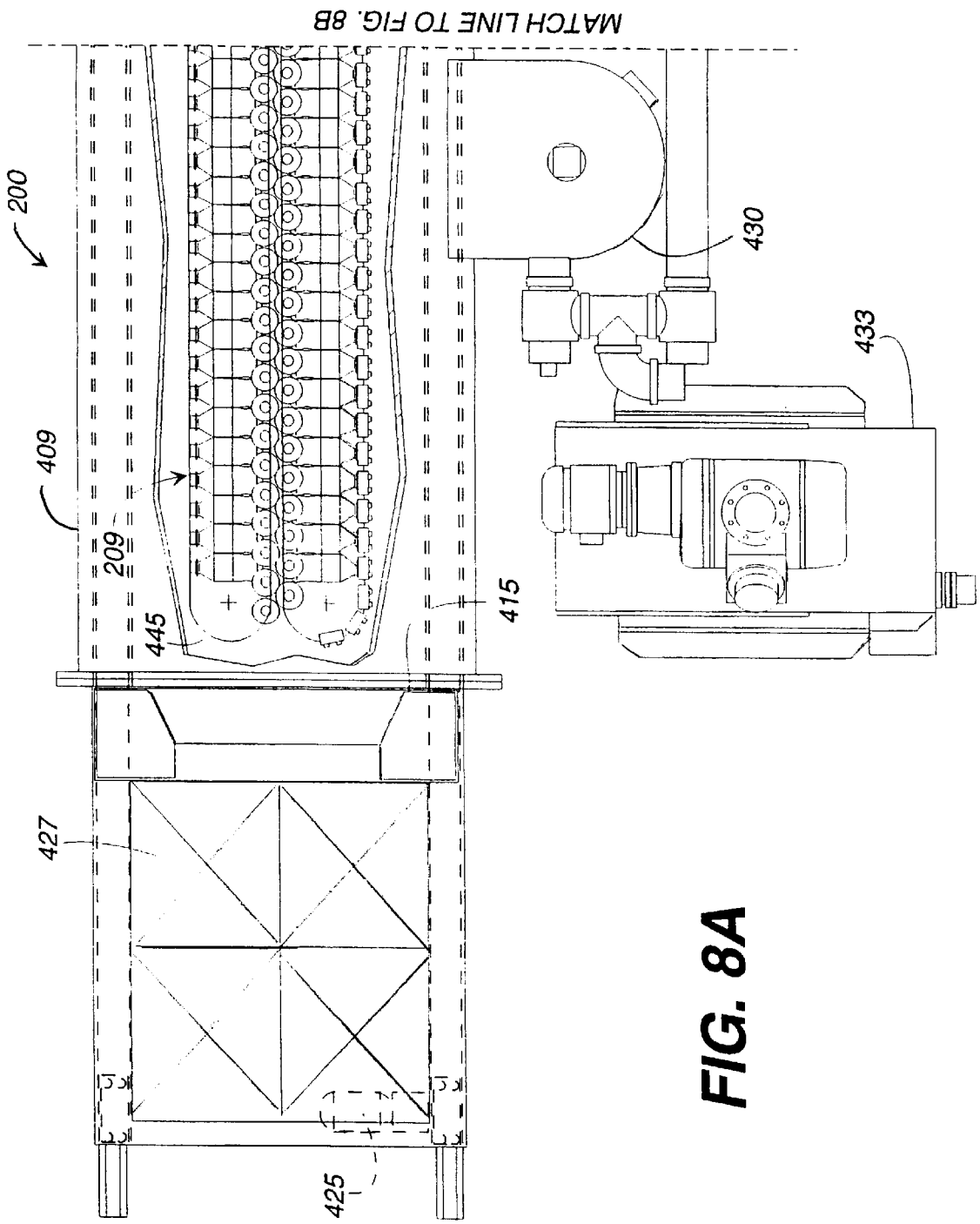

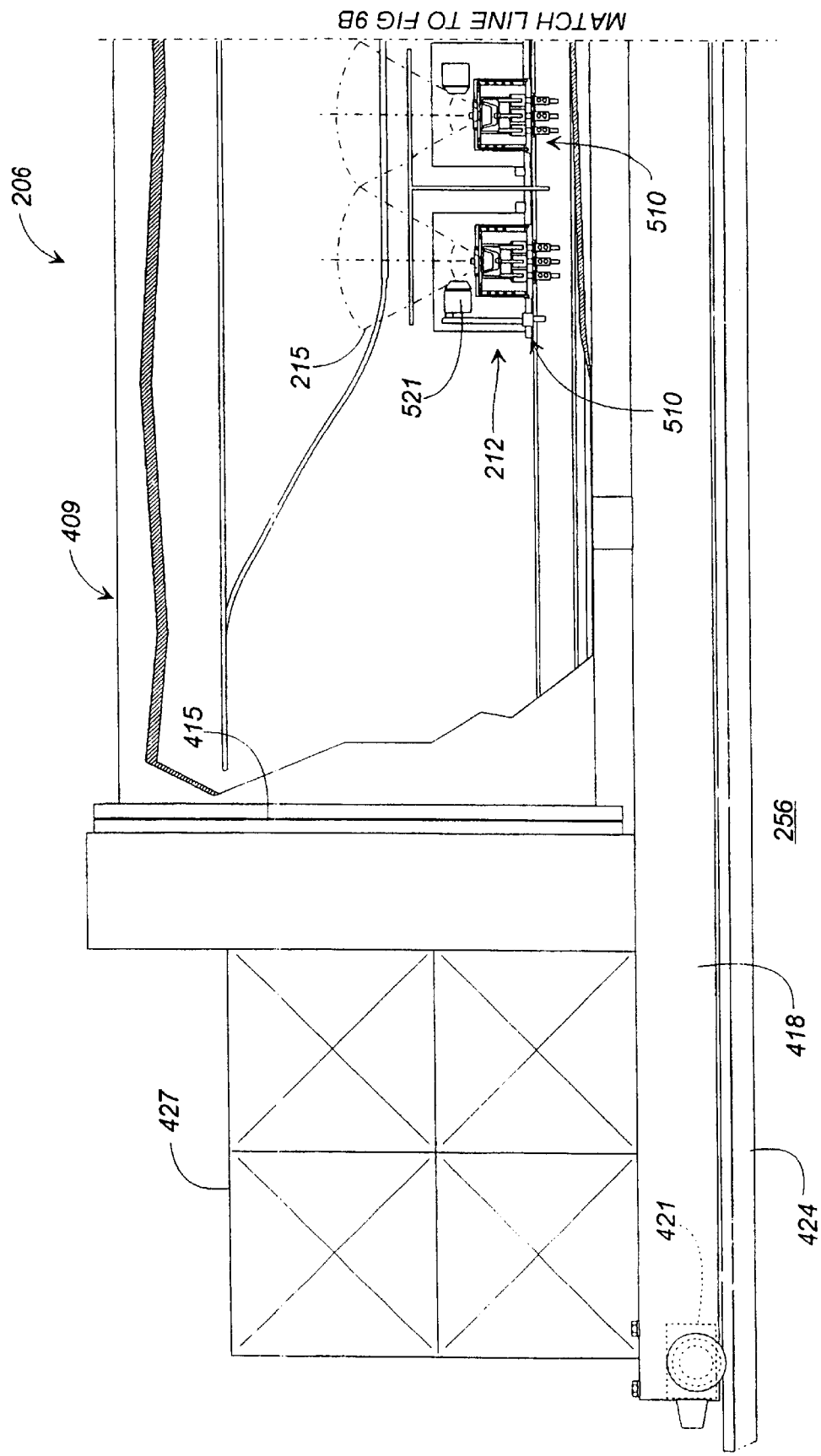

PLASTIC CONTAINERS WITH AN EXTERNAL GAS BARRIER COATING

CROSS REFERENCE TO RELATED APPLICATIONS

This application is a continuation-in-part of U.S. patent application Ser. No. 08/818,342 filed on Mar. 14 1997, the disclosure of which application is expressly incorporated herein by reference in its entirety.

TECHNICAL FIELD

This invention relates to pressurized plastic containers that have enhanced barrier performance and methods to provide said containers and to the coatings. The enhanced barrier performance is obtained by application of inorganic coatings to the external surface of the container. The coatings exhibit enhanced adhesion relative to prior art coatings. In addition, this invention also relates to recycling of coated plastic containers and the packaging of beverages in said container.

BACKGROUND OF THE INVENTION

Plastic containers currently comprise a large and growing segment of the food and beverage industry. Plastic containers offer a number of advantages over traditional metal and glass containers. They are lightweight, inexpensive, nonbreakable, transparent and easily manufactured and handled. However, plastic containers have at least one significant drawback that has limited their universal acceptance, especially in the more demanding food applications. That drawback is that all plastic containers are more or less permeable to water, oxygen, carbon dioxide, and other gases and vapors. In a number of applications, the permeation rates of affordable plastics are great enough to significantly limit the shelf-life of the contained food or beverage, or prevent the use of plastic containers altogether.

It has been recognized for some time that a container structure that combines the best features of plastic containers and more traditional containers could be obtained by applying a glass-like or metal-like layer to a plastic container, and metallized plastic containers. For example, metallized potato chip bags have been commercially available for some time. However, in a number of applications, the clarity of the package is of significant importance, and for those applications metallized coatings are not acceptable. Obtaining durable glass-like coatings on plastic containers without changing the appearance of the container has proven to be much more difficult.

A number of processes have been developed fo purpose of applying glass-like coatings onto plastic films, where the films are then subsequently formed into flexible plastic containers. However, relatively few processes have been developed that allow the application of a glass-like coating onto a preformed, relatively rigid plastic container such as the PET bottles commonly used in the U.S. for carbonated beverages, and heretofore no process has been developed that allows the application of a glass-like coating onto the external surface of a plastic container that is sufficiently durable to withstand the effect of pressurization of the container, retain an enhanced barrier to gases and vapors subsequent to said pressurization, and not affect the recyclability of the containers. Pressurized beverage containers currently comprise a very large market world-wide, and currently affordable plastics have sufficiently high permeation rates to limit the use of plastic containers in a number of the markets served.

Such pressurized containers include plastic bottles for both carbonated and non-carbonated beverages. Plastic bottles have been constructed from various polymers, predominant among them being polyethylene terephthalate (PET), particularly for carbonated beverages, but all of these polymers have exhibited various degrees of permeability to gases and vapors which have limited the shelf life of the beverages placed within them. For example, carbonated beverage bottles have a shelf-life which is limited by loss of $CO_2$. (Shelf-life is typically defined as the time needed for a loss of seventeen percent of the initial carbonation of a beverage.) Because of the effect of surface to volume ratio, the rate of loss becomes greater as the size of the bottle is reduced. Small containers are needed for many market applications, and this severely limits the use of plastic bottles in such cases. Therefore, it is desirable to have a container with improved carbonation retention properties.

For non-carbonated beverages, similar limitations apply, again with increasing importance as the bottle size is reduced, on account of oxygen and/or water-vapor diffusion. It should be appreciated that diffusion means both ingress and egress (diffusion and infusion) to and from the bottle or container. The degree of impermeability (described herein as "gas barrier") to $CO_2$ diffusion and to the diffusion of oxygen, water vapor and other gases, grows in importance in conditions of high ambient temperature. An outer coating with high gas barrier can improve the quality of beverages packed in plastic bottles and increase the shelf life of such bottles, making small bottles a more feasible alternative, and this in turn presents many advantages in reduced distribution costs and a more flexible marketing mix.

Some polymers, for example PET, are also susceptible to stress cracking when they come in contact with bottle-conveyor lubricants used in bottle filling plants, or detergents, solvents and other materials. Such cracking is often described as "environmental stress cracking" and can limit the life of the bottle by causing leaks, which can cause damage to adjacent property. An impermeable outer surface for plastic bottles which surface resists stress-cracking inducing chemicals, prevents damage to adjacent property and will extend the shelf life of plastic bottles in some markets is highly desirable.

Another limitation to shelf life and beverage quality is often UV radiation which can affect the taste, color and other beverage properties. This is particularly important in conditions of prolonged sunshine. An outer coating with UV absorbing properties can improve the quality of such beverages and make plastic bottles much more usable under such conditions.

It is also desirable that plastic containers such as PET bottles be recyclable. Prior art barrier enhanced coatings, however, are often organic and relatively thick and therefore can contaminate a recycled plastic product. Organic coating materials incorporated into recycled plastic make unsuitable containers for beverage or food items because the beverage or food items can contact the organic coating material and become contaminated. In addition, relatively thick coatings form relatively large particles during recycling of plastic material and can damage the appearance and properties of a resulting recycled plastic product. In particular, relatively large coating particles in recycled plastic can make otherwise clear plastic hazy. Hazy plastic is often undesirable for containers such as beverage and food containers.

Finally, the cost of applying a coating to the outside of a bottle, which has a gas barrier which significantly increases the shelf-life of beverage container in that bottle, and/or which significantly reduces product spoilage of beverage container in that bottle, and/or which significantly reduces product spoilage due to UV radiation, and/or virtually eliminates environmental stress cracking, and/or provides a specific color, must not add significant cost to the basic package. This is a criterion which eliminates many processes for high gas barrier coatings, because plastic bottles are themselves a very low cost, mass produced article. Affordability implies in practice that the cost of the coating must add minimal or no increase to the cost of the whole package and in fact, the cost can be less.

A coating on the outside of plastic bottles must be capable of flexing. When bottles are used for pressurized containers, the coating preferably should be able to biaxially stretch whenever the plastic substrate stretches. In addition it is preferable that the coating be continuous over the majority of the container surface. Adhesion is particularly important in the case of carbonated beverages, since the $CO_2$ within the bottle exerts some or all of its in-bottle pressure on the coating. This pressure can rise to above 6 bar, exerting considerable forces on the coating/plastic interface. The coating must also resist scuffing, normal handling, weathering (rain, sun climate, etc.), and the coating must maintain its gas barrier throughout the bottle's useful life.

There are several plasma-enhanced processes which apply an external, inorganic coating to a range of articles, which in some cases includes bottles. Many of the processes are targeted to provide coating properties which are quite different, and far less onerous than high gas barrier bottle coatings. Such processes target, for example, abrasion resistance, where the coating continuity is not a major factor, since the coating can protect the microscopic interstices. Other processes target cosmetic or light-reflection properties and some processes have a pure handling protection role. Often the substrate does not flex nor stretch and the article itself is higher priced than plastic bottles so that cost is not a benefit of the design. In some cases, the substrate allows far higher coating temperatures than those allod by PET, the most common plastic-bottle material. Such processes do not, in general, provide the coating continuity, adhesion, flexibility needed for high gas barrier coatings, nor do they provide a solution to the other problems relating to high gas barrier coatings, described above.

Prior art also exists for gas barrier processes for bottles, but the lack of commercially available, coated bottles for pressurized application is due to the fact that these processes lack the desirable attributes described above and fail to provide a coating with adequate adhesion, continuity and/or flexibility under high in-bottle pressure or a coating which avoids recycling problems, or the low cost necessary to make the coating affordable.

U.S. Pat. No. 5,565,248 to Plester and Ehrich describes a method for coating containers internally. However, external coatings require far greater adhesion than internal coatings, because in-bottle pressure acts against external coatings, and internal coatings are not subject to the same handling and/or abrasion in use. For these, and other reasons, coating bottles externally differs from coating them internally and the present invention is therefore substantially different.

For plastic containers such as PET bottles to be economically feasible containers for commercial products such as beverages and food, the bottles must be manufactured relatively inexpensively at a high speed and high volume. Accordingly, a process and system for coating plastic containers must be economical and capable of functioning at a high speed and high volume. Many prior art systems for coating objects with a gas barrier coating are batch processes or otherwise slow and inefficient.

Accordingly, there is a need for plastic containers which are coated with an effective gas barrier coating, can be efficiently recycled, and can be economically produced for use as containers for mass produced items such as beverages and food.

SUMMARY OF THE INVENTION

Accordingly, it is an object of the present invention to provide an outer coating or layer for a container such as a heat sensitive plastic bottle, and particularly for the non-refillable bottles used for carbonated beverages.

It is a further object of the present invention to provide a coating and a system and method for coating which can provide an external glass-like coating that is flexible, durable and possess sufficient adhesion to withstand the effects of pressurization, such as flexing and stretching of the container, and to withstand denting of the container, without significant loss of enhanced barrier properties.

An additional object of the present invention is to provide an externally coated container which will avoid environmental stress cracking such as when the container comes into contact with conveyor lubricants during filling and detergent, cleaners or solvents or similar substances during its life cycle. Such lubricants can include 409™, Mean Green™ or other commercially available cleansers or lubricants, etc.

Yet another object of the present invention is to Bide a lighter container and a system and method for making the container whereby an amount of plastic utilized in making the container as compared to a conventional container can be reduced without adversely affecting or while improving the gas barrier effectiveness of the container.

It is another object of the present invention to provide a coating that comprises an inorganic oxide layer on the external surface of a plastic container, the inorganic oxide layer being further distinguished by being comprised of greater than or equal to 50 and up to but less than 100% $SiO_x$ (x=1.7 to 2.0).

Another object is to provide a coating which possesses sufficient adhesion to the external surface of the plastic container so that the barrier enhancement provided by the inorganic oxide layer is not substantially reduced upon pressurization of the container to a pressure between 1 and 100 psig.

A further object of the present invention is to provide a method for applying an inorganic layer as described above, the method resulting in a robust inorganic oxide layer that provides an effective level of barrier enhancement to the plastic container and does not result in significant physical distortion of the container.

It is a further object of the present invention to provide a system and method for manufacturing a container whereby the aesthetic appeal of the container will be enhanced by applying a colored inorganic layer that further contains visible-light absorbing species.

Yet another object of the present invention is to provide a coating for a container with UV absorbing capabilities.

Still another object of the present invention is to provide a container with a colored or clear coating which can easily be recycled without significant or abnormal complications to existing recycling systems.

Another object of the present invention is to provide a system and method for inexpensively manufacturing an externally coated container at high speed and high volume.

Yet another object of the present invention is to provide a method in which the thickness and composition of the applied coating on a container can be rapidly and easily determined and whereby process control and insurance of enhanced barrier performance can be obtained.

A further object of the present invention is to provide a method to determine the condition of the surface of a plastic container at least with regards to its suitability for applying glass-like coatings.

Another object of the present invention is to provide a high gas barrier which considerably increases the shelf life of the containers such as plastic bottles and to provide the containers with good transparency so as not to affect the appearance of a clear plastic bottle.

Still another object of the present invention is to provide a container with adequate durability and adhesion during working life, when the outer surface of the container is subjected to environmental conditions such as severe weather, rubbing, scuffing, or abrasions (for example, during transportation).

Also, another object of the present invention includes the ability to enable coating to heat sensitive plastic containers with coating materials, which can only be vaporized at very high temperatures without an acceptable increase in the plastic's temperature and which must remain in many cases below 60° C.

The foregoing and other objects of this invention are fulfilled by providing a coated plastic container comprising a plastic container body having an external surface and a coating on the external surface of the container body comprising an inorganic oxide and a glass forming metal additive, wherein the coated plastic container, when containing a pressurized fluid sealed in the interior space of the container body at a pressure of 60 psig, possesses a gas barrier of at least 1.25× the gas barrier of the container without the coating, when the container without the coating contains a pressurized fluid sealed in the interior space at a pressure of 60 psig. This invention also encompasses a method and system for making a coated plastic container possessing a gas barrier, a method for recycling coated plastic containers, and a method and system for packaging beverages sealed in plastic containers including a gas barrier coating.

More particularly, the coated plastic container of this invention is made by depositing the coating on the exterior surface of the container body using vacuum vapor deposition, desirably plasma-enhanced vacuum vapor deposition. The resulting coating is desirably substantially homogeneous and amorphous and bonded either chemically or physically, or both, to the exterior surface of the container. As used herein, the term homogeneous means there is no substantial variation in atomic composition through the coating and the term amorphous means there is no substantial crystallinity in the coating as measured by standard x-ray diffraction techniques. In addition, the inorganic oxide and glass-forming metal additive are preferably present in the coating in concentrations which are substantially constant through the thickness of the coating. The resulting coating is therefore very durable.

Because of the high level of adhesion of the inorganic coating to the surface of the plastic container of the present invention, a continuous coating is not essential. In other words, even though the coating of the present invention may be non-continuous because of scratches or fractures therein, for example, the coating will continue to effectively adhere to the substrate such as an underlying plastic bottle. The present invention can therefore provide an effective gas barrier even if the surface is highly fractured. A high gas barrier of 1.25× greater than the uncoated container can be obtained with the present invention and this barrier can even be 1.5× or preferably 2× greater than the uncoated container even when the coated container contains a pressurized fluid such as a carbonated beverage. In addition, the coated container of this invention has enhanced environmental stress crack resistance even when the container contains a pressurized fluid.

Furthermore, the coated container of the present invention can be made to have an equivalent gas barrier and reduced weight compared to a plastic container of similar surface area and volume and without said exterior inorganic coating.

The system of the present invention for malking the coated plastic container comprises a vacuum cell, a container feeder, a conveyor and at least one source disposed in the vacuum cell for supplying a coating vapor. The vacuum cell is capable of maintaining a vacuum within the vacuum cell and the container feeder supplies plastic container bodies into and withdraws coated plastic containers out from the vacuum cell. The plastic container bodies each have an external surface and an interior surface defining an interior space. The conveyor conveys the plastic container bodies through the vacuum cell and the at least one source of coating vapor supplies coating vapor to the external surface of the container bodies as the container bodies are conveyed through the vacuum cell. The at least one source of coating vapor and the conveyor are structured and arranged within the vacuum cell such that the coating vapor from the at least one source deposits a thin coating on the external surface of the containers, the thin coating comprises an inorganic oxide and a glass forming metal additive and bonds to the external surface of the container bodies and the resulting coated plastic containers, when containing a pressurized fluid sealed in the interior space at a pressure of 60 psig, possess a gas barrier of at least 1.25× the gas barrier of the containers without the coating, when the containers without the coating contain a pressurized fluid sealed in the interior space at a pressure of 60 psig. This invention also encompasses the corresponding method of making coated plastic containers.

Desirably, the system and method for making coated plastic containers of this invention are continuous and can operate at a high speed and high volume to economically mass produce the coated containers. More particularly, in the system and method for making a coated plastic container of this invention, while the vacuum cell maintains a vacuum within the vacuum cell, the container feeder continuously feeds the container bodies from outside the vacuum cell into the vacuum cell to the conveyor, the conveyor continuously conveys the container bodies through the vacuum cell passed the at least one source, and the container feeder continuously feeds the coated containers from the conveyors and withdraws the coated containers from the vacuum cell. Preferably, this system and method are automatic. The container feeder in the system and method of this invention is desirably a rotary feeder system capable of continuously and automatically feeding container bodies into and out of the vacuum cell at a high speed and a high volume while the vacuum cell maintains its vacuum. This high speed process allows the system and method of coating plastic containers to be placed in a high speed mass production process such as a beverage packaging line.

The coating vapor produced in the vacuum cell is desirably in the form of a plasma. A suitable device for producing the plasma is a cold cathode, also known as an electron gun. The plasma can optionally be energized with one or more antennas disposed in the vacuum cell using RF (radio frequency) or HF (high frequency) energy to form a high energy plasma.

Although a variety of vaporizable materials can be used to form the inorganic oxide coating in accordance with this invention as explained in more detail below, the inorganic oxide coating desirably comprises silica and glass forming metal additives such as zinc, copper, or magnesium.

The coating method and system of this invention also enables heat sensitive containers to be coated without significant temperature rise, and at all times maintaining a bottle temperature well below 60° C. In addition, the coating method and system of this invention enables mixtures and layers of substances to be applied which can be chosen for their color, or UV-absorbing properties, or additional gas barrier properties. Further, the method and system of this invention enables coatings, such as silica, which are fully transparent and clear, and would therefore not affect the appearance of an otherwise clear bottle. The coating materials are inert and remain solid when the plastic bottle is melted for recycling.

Additional functionality can be incorporated into the inorganic coating of this invention by incorporating visible light absorbing species, rendering the plastic container cosmetically more appealing.

The method of this invention for producing recycled content plastic comprises the steps of providing a batch plastic, at least a portion of the batch plastic comprising coated plastic containers, and converting the batch of plastic to a form suitable for melt extrusion. Each coated plastic container comprises a container body having an external surface and a coating on the external surface comprising an inorganic oxide. The coated plastic containers can be made by the method described above and desirably have a very thin inorganic oxide coating. The coating preferably has a thickness from about 1 to about 100 nm.

Suitable methods of converting the batch of plastic to a form suitable for melt extrusion include grinding the batch plastic to produce flakes and melting the flakes to form a melt extrudable recycled plastic. Alternatively, the batch of plastic can be depolymerized and repolymerized to form a melt extrudable recycled plastic. The recycled plastic can be melt extruded into plastic articles such as recycled content plastic containers.

Because of the inert nature and thinness of the coatings of the present invention, the coated containers can be processed in any conventional recycling system without modification of the process. In addition, haziness in the resulting recycled articles is avoided in the present invention because the coating forms relatively small particles during recycling. Furthermore, the coating particles in the recycled plastic are acceptable for food contact and therefore do not adversely affect the recycling effort when ground or depolymerized in the recycling process.

The recycling method of the present invention provides for a method of recycling coated plastic which has results heretofore unattainable. In particular, separation of coated and uncoated plastics is unnecessary whereby modifications to existing recycling systems are unnecessary or whereby extra process steps (separating coated bottles from uncoated bottles) can be avoided. Moreover, it is possible to produce a transparent plastic from coated plastic while avoiding the above-noted problem of haziness in the final recycled product. While the present invention can be used in recycling many types of plastic, it is contemplated that this invention can be used with plastic articles, such as containers or bottles and more particularly, with plastic beverage bottles. Bottle-to-bottle recycling remains unaffected with the present invention. The coating of the present invention does not interfere with the downstream injection molding or blow molding of recycled plastic.

The method of packaging a beverage in accordance with this invention comprises the steps of providing a coated plastic container, filling the plastic container with the beverage and sealing the plastic container after the step of filling. The coated plastic container comprises a plastic container body having an external surface and a coating on the external surface comprising an inorganic oxide. This coating provides a gas barrier and desirably is the coating described hereinabove. The gas barrier coating inhibits the flow of gas into and out of the container. For example, the gas barrier coating can protect the beverage from the flow of oxygen into the container from the outside or can inhibit the flow of carbon dioxide out of the beverage container. The method and system of packaging a beverage according to this invention is particularly useful in producing carbonated beverages. Such a method further comprises the steps of carbonating the beverage before the filling step and then sealing the beverage under pressure in the coated container. The resulting carbonated beverage has a longer shelf life because the coating on the container better holds the carbon dioxide within the container.

The method and system of packaging a beverage according to this invention is desirably a high speed, high volume process wherein the coated plastic containers are continuously provided, the plurality of plastic containers are continuously filled with the beverage, and the filled containers are continuously sealed. Accordingly, the method and system for packaging a beverage can form a single continuous processing line including the plastic container body production, the process for coating the plastic container, and the steps of filling the plastic containers with a beverage and sealing the plastic container after the step of filling, although such a single continuous processing line is not necessary.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

The present invention will be more readily understood from the detailed description given hereinbelow and the accompanying drawings, which are given by way of illustration only and thus are not limitative of the present invention, and wherein:

FIG. 1A is a partial schematic illustration showing the receptacle 3 and a supplemental receptacle positioned on a support 19 useful in the embodiment illustrated in FIG. 1;

FIG. 1B is a partial schematic illustration of a coating system similar to FIG. 1, but showing a modified form of the coating chamber in accordance with another embodiment of this invention;

FIG. 2A is an elevation view of an in-bottle antenna and bottle-capping arrangement before insertion of the antenna;

FIG. 2B is a cross-sectional view of the in-bottle antenna and bottle-capping arrangement of FIG. 2A after insertion of the antenna;

FIG. 2C is a cross-sectional view showing a modified form of an in-bottle antenna prior to insertion;

FIG. 2D is a cross-sectional view similar to FIG. 2C after insertion of the in-bottle antenna;

FIG. 5A is a partial elevation view of a system for conveying bottles first vertically, then horizontally while bottles are continuously rotated;

FIG. 5B is a sectional view of the bottle bar taken along line V—V of FIG. 5A;

FIGS. 8A and 8B are a partial plan view of a high speed, high volume plastic container coating system in accordance with still another embodiment of this invention with the interior of the container feeder and vacuum cell exposed;

FIGS. 9A and 9B are a partial side elevation view of the coating system illustrated in FIGS. 8A and 8B with the evaporators and interior of the container body feeder exposed. The conveyor is not shown in FIG. 9A and 9B;

DETAILED DESCRIPTION OF THE PREFERRED EMBODIMENTS

Coatings with good adhesion to a surface of a container, good gas barriers, and providing the necessary stretchability and flexibility can be produced by the methods and systems of the present invention. Throughout the present specification, a container or bottle will be described. An uncoated container is referred to as a container body. While this container body will generally be described with reference to a plastic bottle, any suitable container can be treated by the method and system of the present invention. Accordingly, soft drink bottles of various sizes, other food containers or any other suitable container can be treated using the disclosed method and system.

COATING SYSTEMS USING BIASING ENERGY

Coating System

Figure 1:
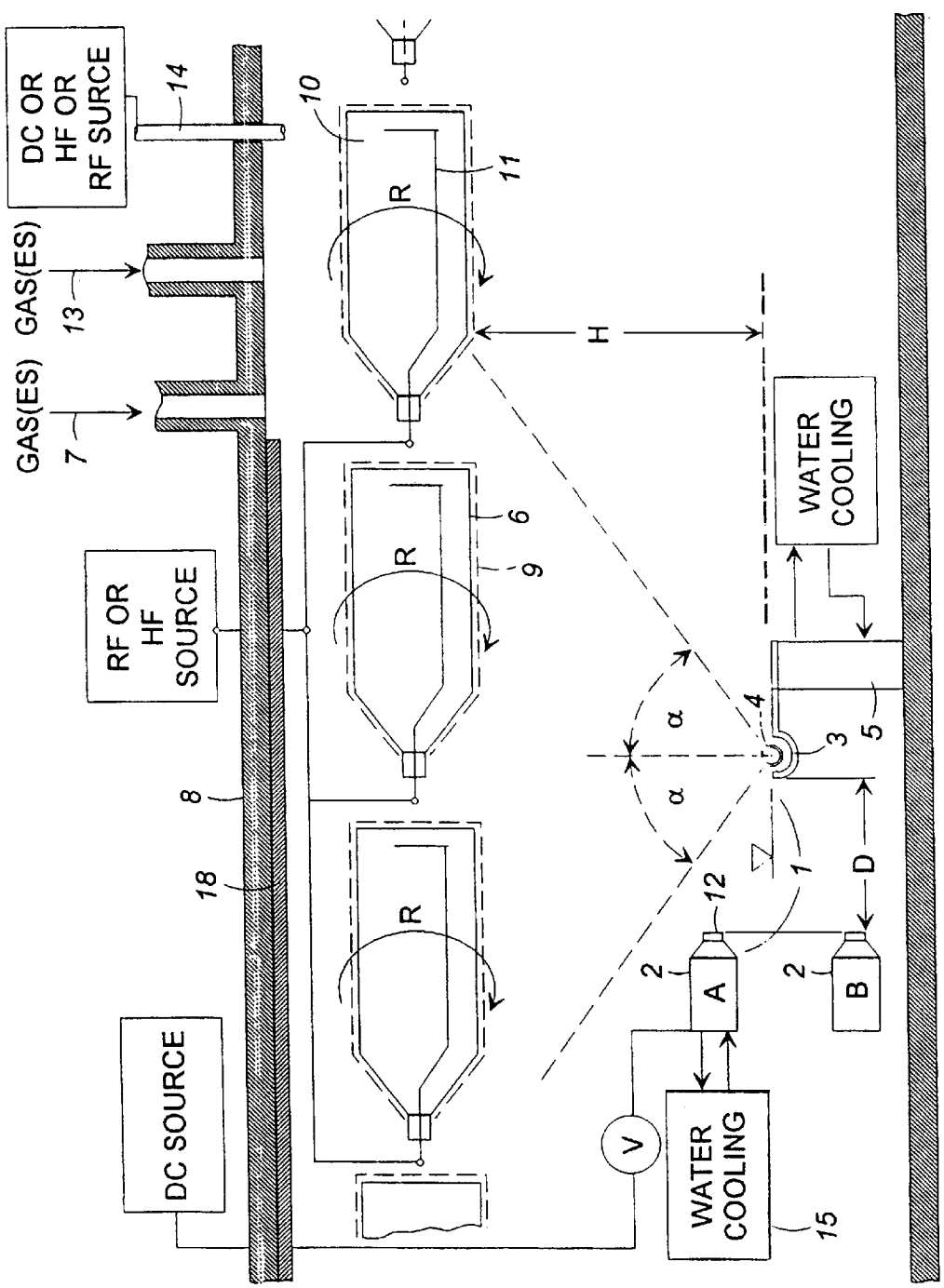
FIG. 1 is a partial schematic illustration of a system for coating plastic containers according to a first embodiment of this invention wherein biasing energy is used.

FIG. 1 shows a source 1 used as typical evaporation and plasma-making system for this present invention. A conventional, water-cooled cold cathode or electron gun 2 is used to convey energy to a conventional receptacle 3, which holds the coating material 4. This receptacle 3 is constructed of a material suitable for melting and evaporating the particular coating material chosen, and must be both inert and resistant to the temperature necessary for generating the quantities of vapor needed. For example, for evaporating silicon, carbon has been found to be a suitable material. The receptacle 3 is supported from a receptacle holder 5, which is water cooled or cooled by other methods.

A potential is connected across the cold cathode 2 and the receptacle 3, with the cold cathode being at the negative (cathodic) pole and receptacle being at the positive (anodic) pole, so that energy in the form of a stream of electrons can flow between the cold cathode and the receptacle. By using these conventional components (i.e., cold cathode or electron gun 2 and receptacle 3), and by varying the position of the cold cathode 2 relative to the horizontal surface of the receptacle 3, the proportion of energy available for plasma-making and evaporation can be adjusted. For example, in position A, a large portion of the energy is available for plasma-making, while in position B, almost all energy is used for evaporation and hardly any plasma is formed. The degree of energy to the source 1 is adjusted by the voltage V to give the particular deposition rate on the external bottle surface 6 which enables coating material 4, after evaporation, to deposit and react completely (i.e., stoichiometrically) with the gaseous substance 7 (or mixture of substances) introduced into the coating chamber 8, thus ensuring that no significant amounts of unreacted gas can be occluded within the coating 9. For example, in one of the preferred embodiments, which uses silicon as coating solid 4 and oxygen as gaseous substance 7, deposition rates onto the coating surface of 1 to 50 nm/s can give fully transparent coatings, with virtually x=2 in $SiO_x$, while avoiding surplus oxygen (or air) and maintaining high vacuum in the coating cell (in region of $10^{-5}$ mbar to $10^{-2}$ mbar).

For producing good gas barrier results, it is beneficial to ensure that an on-surface reaction between coating material 4 and gaseous substance 7 takes place after the coating material 4 has been deposited and formed a solid lattice, since the gaseous substance 7 then densifies the coating 9 by reacting into the solid lattice. The distance H between a surface 6 of a container body 10 and the receptacle 3 is important when avoiding the coating material 4 which reacts with the gaseous substance 7 before the coating material 4 is deposited onto the container surface 6. Equally, the condition of the coating material 4 is important in securing maximum on-surface reaction. A distance H is chosen so as to give optimal use of source 1 (thus enabling it to coat as many bottles 10 as possible. Distance H is dependent on vacuum and deposition rate, but generally in region 0.50 m to 2 m. Also, increasing distance H, within the limitations described, enables high-energy plasmas to be created at source 1 without heat-damaging the container body 10.

The plasma generated in the vacuum cell can be a high-energy plasma, determined by position of cold cathode 2, voltage V, the distance between cold cathode and receptacle 3, and the coating angle a which is desirably in the range from 0 to 70°. Optionally, biasing energy, provided by locating an antenna 11 inside the bottle or container body 10 and connecting it to an RF or HF source, can be used to energize the plasma. Depending on the material of bottle 10, biasing energies of up to 2000 V can be used. Excessive bias voltage can be detrimental by overheating and damaging the bottle surface 6.

Rotation of bottle 10 enables the bottle 10 to be coated over its entire surface at a high rate of deposition of coating material 4 while allowing time for reaction with gaseous substance(s) 7. When coating the sidewall, the rate of deposition of coating material 4 onto the part of the surface of bottle 10, which is directly opposite source 1 and which is the only surface receiving significant deposition of coating material 4, can be adjusted by rotating bottle 10 at an adequate rate, so that this deposition comprises only a few molecular layers. These molecular layers can be easily reacted with gaseous substance(s) 7, thus achieving the desired criterion of on-surface reaction with a solidified deposit, since this helps provide the required dense, continuous coating which gives good gas barrier. Also, since that part of the surface of bottle 10, which is not opposite source 1, can continue to react while not receiving deposition of coating material 4, this procedure brings the whole 360° circumference of bottle 10 into the deposition/reaction cycle and reduces coating time. Therefore, correct setting of rotation rate (R) helps secure full reaction at optimal coating rate conditions.

Small or trace additions of certain metals in silicon dioxide and other coatings can increase gas barrier. Such metals can be described as glass-forming metal additives because they are known as additives for use in making glass. Suitable glass-forming metal additives include Ag, Al, Ca, Cr, Cu, Fe, K, Mg, Mn, Na, Ni, Sn, Ti, and Zn. These metals are added to form a proportion of metal-in coating 9 of 0.01 to 50%. For example, such additions to a coating 9 mainly composed of $SiO_2$ increase the gas barrier by a factor of 2, or more. Such metals are added either to receptacle 3, or are provided by the sacrificial erosion of the electron emitting plate or shield 12 of the cold cathode 2, this being constructed out of the desired metal, or mixture of metals.

Alternatively, as shown in FIG. 1A, a separate receptacle 16 can be provided for holding a source 16' of metals. The receptacles 3 and 16 can be supported on the floor of the coating chamber 8 as shown in FIG. 1, or on a support 19 as shown in FIG. 1A or at any suitable location. The cold cathode 2 can act on the materials 3', 16' in both respective receptacles 3, 16 or two separate cold cathodes can be provided. Also, the spacing between the receptacles 3, 16 can be relative close as shown in FIG. 1A or they can be further apart or the spacing can be varied.

In FIG. 1B, an alternative embodiment of the coating chamber 8 is used. Instead of using in-bottle antennas 11 or coating cell antenna 14 or in addition to these antenna 11, 14, an external biasing antenna 28 is used. This antenna 28 is for biasing during coating. Of course, this is separate to the already shown out-of-bottle antenna 14 for pretreatment. While not indicated in FIG. 1B, appropriate means are provided for holding and/or transporting the container bodies 10. While a continuous or semi-continuous process for treating the bottles or container bodies 10 is discussed below, it should be evident that the present invention is also applicable to batch processing.

While not shown in FIGS. 1, 1A or 1B, an automatic source for supplying the material to receptacle 3 and/or 16 can be provided. These materials can be supplied as a rod or other solid structure or in any other form. It is contemplated that material in the receptacle 3 will be provided to receptacle 3 in solid form and in particular wiii bue iii a chunky or nonpowder form. By minimizing the surface area of this material, detrimental effects of oxidization can be avoided. The material in the receptacle 3 (and 16, if present) will be a source of vapor in the coating chamber when acted upon by the cold cathode 2. This vapor will be deposited on the bottles or container bodies 10 as will be described below. It should be noted that wiring 17 is indicated in FIG. 1A attached to the receptacle 16. This wiring 17 can be used to supply current to the receptacle 3 and/or 16 as described in U.S. Pat. No. 5,565,248, if so desired. Of course, such wiring can be omitted.

When the shield or plate 12 is used as a source, the degree of erosion can be approximately controlled by adjusting distance D between receptacle 3 and cold cathode 2, and by the degree of cooling applied to plate or shield 12 by the means for cooling 15. This means for cooling 15 can cool one or both of the cold cathode and the plate or shield 12. Water cooling or any other suitable cooling can be provided by this means for cooling 15. The other main variable affecting erosion of plate 12 is the voltage V applied to the cold cathode 2, but this is normally adjusted independently according to the plasma generation and evaporation rate requirements.

Coating Materials

The choice of coating material 4 and gaseous substance 7 depends on the process criteria (cost, coating color, degree of gas barrier necessary size of bottle and particularly the type of plastic used in the bottle). Good gas barriers have been obtained by procedures described above by means of on-surface reaction of silicon with oxygen, giving $SiO_x$ where x is normally greater than 1.7, and normally insignificantly less than 2 and thus, glass-like transparent coatings. It is contemplated that the coating contains 0.01 to 50% of one or more of the glass-forming metal additives selected from the group consisting of Li, Na, K, Rb, Cr, Mg, Ca, Sr, Ba, Ti, Al, Mn, V, Cr, Fe, Co, Ni, Zn, Cu, Sn, Ge and In.

Use of metals and other gaseous substances also enables colored coatings, or UV-absorbent coatings (by choosing the reactants appropriately). More than one layer, each layer comprising a different composition, can also be beneficial, particularly when producing colored coatings, since combining colored and transparent layers enables a good gas barrier to be obtained with minimum thickness of colored coating, thus enhancing recyclability. When more than one type of substance is used as coating solid 4 it is often necessary to provide more than one source 1, since differences in vapor pressure between substances can result in fractionation and uncontrolled proportions of each substance in the coating 9. Furthermore, it is possible, using the systems and methods disclosed herein, to coat plastic container bodies with metals which are not oxides, but rather, are elemental metals. For example, plastic container bodies can be coated with elemental aluminum or silicon by eliminating the use of reactant gas from the vacuum cell.

Container Pretreatment

For certain plastic surfaces, surface pretreatment, for lightly activating bottle surface 6 by forming free radicals on the surface, is useful. Such pretreatment is possible using a gaseous pretreatment substance 13, which can often be the same as the gaseous substance 7, and at same cell pressure conditions. For some plastic substrates, it can be useful to degas the bottle surface 6 to remove absorbed moisture and low molecular weight materials. This is achieved by holding the bottle 10 in a vacuum for a period of 5–180 s. Bottles or container bodies 10 blown immediately after blow molding can be degassed relatively quickly, and location of coating process beside a blow molder is desirable. Such pretreatments can be carried out either by using the in-bottle antenna 11 with RF or HF energy to create a gas-plasma on bottle surface 6, or by connecting a coating cell antenna 14 to a DC or HF or RF source and creating a plasma within the entire cell.

For certain compositions of coating 9, it is desirable to apply the coating on a bottle 10, which during the coating process has an internal pressure significantly higher than the cell pressure. This gives improved gas barrier by enabling coating 9 to relax/contract when bottle 10 is not under pressure while also enabling coating 9 to resist cracking due to stretching when bottle 10 comes under pressure in normal use.

Some plastic surfaces, particularly those of PET, which is a polymer most commonly used in plastic bottles, deteriorate after blow molding due to the migration to the surface of low molecular weight components. It is important to determine the quality of the bottle surface 6 prior to coating. Under scanning electron microscope, these migrating components can be observed on bottle surface 6, and an important quality control can thus be applied.

For quality control, it has also been demonstrated that Rutherford-Back-Scatter (PBS) is able to determine the thickness of very thin coatings (e.g. 50 nm) and also their composition, the latter being important when coating with more than one solid component. Xray fluorescence also can be used to measure coating thickness, and, because this is a relatively simple process, X-ray fluorescence can be applied as an in-line quality control system after a coating machine. Finally, observing the surface of coated bottles 10 under a scanning electron microscope after these bottles 10 have been subjected to gas pressure, enables a first indicator of coating performance, since coatings 9, with poor gas barrier performance, have tendency to crack/peel.

Antenna and Bottle Capping Arrangement

FIG. 2 shows an antenna and bottle capping arrangement, as an example. Other similar arrangements achieving the same result are possible. A cap 20 incorporates a sealing ring 21, a threaded portion 22, a snap-in, quick-release connector 23 and a contact ring 24 for the biasing voltage which can be applied either by RF (radio frequency) or HF (high frequency). The contact ring 24 has an electrical connection 25 which has a sliding contact with the antenna stem 26. The antenna stem 26 is mounted in a bearing 27, which is in turn mounted inside the cap 20, and is free to rotate within the cap. The antenna 30 has the antenna stem 26, hinged arms 31a, 31b, light antenna segments 32a, 32b and a heavy antenna segment 33. Hinged arm 31b also acts as antenna for the base of bottle 10 when extended. At the base of the antenna stem 26 is a ball bearing 34, which can rotate freely, and is pressed downward by a spring 35 and a pin 36. When antenna 30 is outside the bottle 10, the antenna segments 32, 33 are folded against the antenna stem 26, due to the action of the spring 35, as shown in FIG. 2A. Pin 36 has a base stop 37 and a swivel 38 to which the hinged arm 31b and the antenna segment 32b are connected. As pin 36 moves up/down, hinged arm 31b and antenna segment 32b extend outward or fold against antenna stem 26. When the antenna 30 is inserted into the bottle 10, the ball bearing 34 is forced to compress the spring 35 and this extends the hinged arm 31b outwardly from the antenna stem 36, which erects the antenna 30 so that all its segments 32a, 32b and 33 approach the walls of bottle 10. A gap between walls of bottle 10 and antenna 30 is maintained which is as close to the walls of bottle 10 as possible, but without touching, and is in practice between 3 and about 15 mm.

Cap 20 is screwed onto the threaded finish (mouth) of bottle 10 and the gaseous content of bottle 10 is thereby sealed by sealing ring 21. A tool (not shown), enters the connector 23 in cap 20 and provides the screw driver action for turning the cap 20 to screw it onto bottle 10. The same tool holds the bottle 10 (until released by connector 23) and makes contact with the RFJHF biasing voltage on contact ring 24. Of course, a snap-in, quick-release connector or other known connections for cap 20 instead of a screw connection could also be used. When the bottle 10 is held and turned horizontally, the heavy antenna segment 33 ensures that the antenna 30, which has no contact with the walls of bottle 10, is able to maintain a position facing vertically downwards and therefore acts as means for orienting the antenna to generally face the at least one source during coating. When antenna 30 is oriented while bottle 10 is rotated in vertical position, use of a magnetic material in antenna segment 33 and an external magnet, appropriately positioned, enable the antenna 30 to face in the correct direction. Accordingly, this magnet will act as magnetic orienting means for orienting the antenna when the longitudinal axis of the container is generally vertically oriented.

The principle demonstrated by FIGS. 2A and 2B can also be applied to a multi-segment design. In such a multi-segment design, where a plurality of antenna segments 32a, 32b, 33 and hinged arms 31a, 31b enable a folding arrangement which can pass through the finish of bottle 10 and can be erected within bottle 10 giving a 360° C. antenna-coverage of its walls. In such a case, the need for antenna orientation is eliminated and a greater portion of the bottle is subject to biasing energy, enabling shorter coating times in certain applications.

Moreover, apart from using the antenna 11 or 30 a back plate 18 in the vacuum cell can be provided as indicated in FIG. 1. The bottles or container bodies 10 are positionable between this back plate 18 and the source 1. When used, this back plate can result in the insertion of an antenna 11 or 30 into bottles 10 being unnecessary. This can speed the overall process, reduce the need to have an inventory of antennas and can provide other benefits.

Alternatively, a portion or all of the vacuum cell 50 or coating chamber 8 can be used as an antenna. For example, the back plate 18 can be omitted and the ceiling alone or the ceiling and some of the walls or the entire chamber 8 can be used as the antenna. Other arrangements are also possible.

Figure 3:
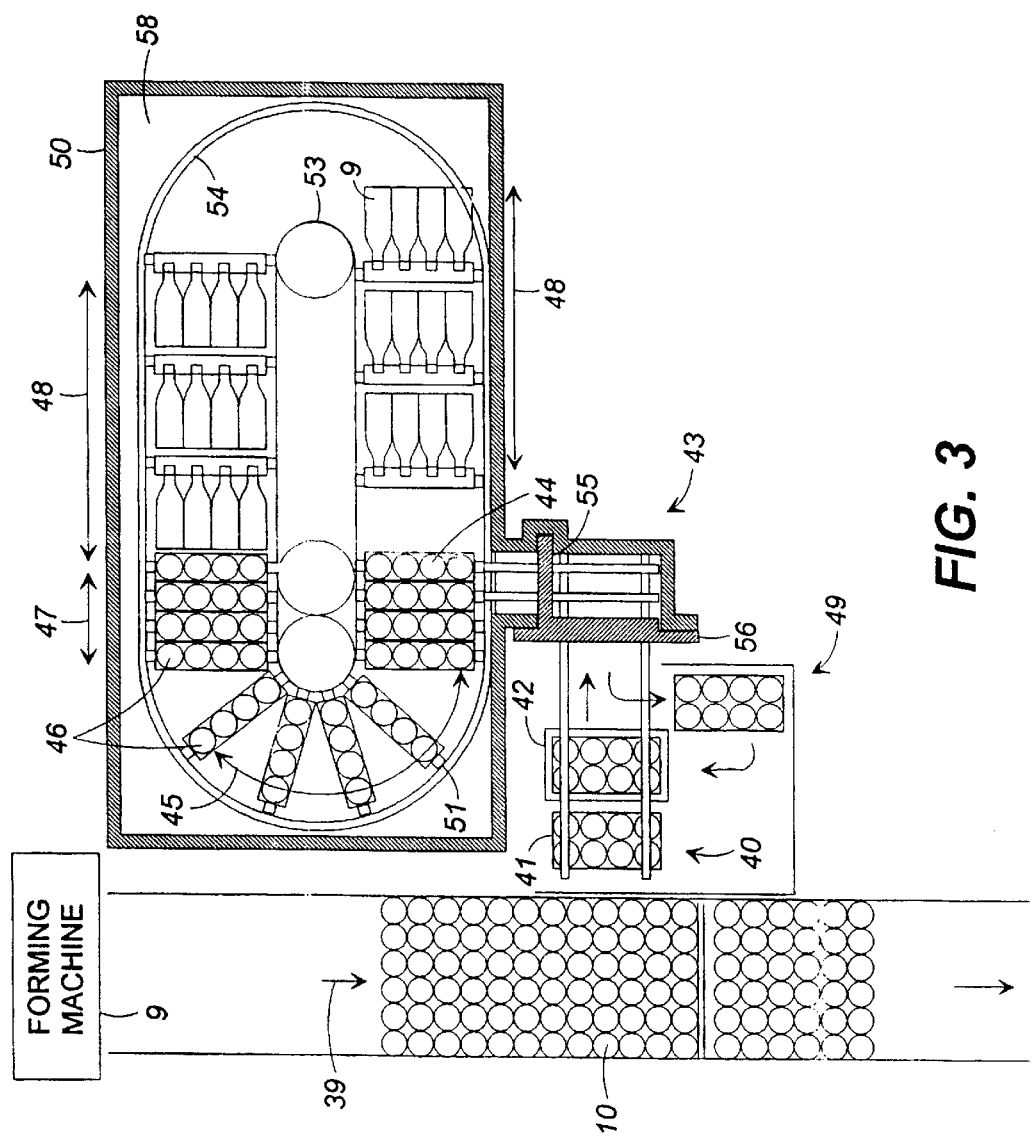
FIG. 3 is a schematic illustration of a coating system in accordance with another embodiment of the present invention using biasing energy.

Another potential for avoiding the antennas 11 or 30 comprises providing a magnetic source within the vacuum cell 50 as generally indicated by numeral 58 in FIG. 3. The number of magnetic sources 58 and there location within vacuum cell 50 can readily be varied. This magnetic source 58 acts as a means for generating a magnetic field within the vacuum cell 50 wherein the field directs the coating vapor.

This magnetic source could alternatively be used to selectively direct the coating vapor going to the bottle surface, thereby avoiding some or all of the need to mechanically rotate or translate the bottles. This magnetic source will therefore act as means for generating a field to direct the coating vapor.

While still using an in-bottle antenna, FIGS. 2C and 2D show another possible type of antenna 69. This antenna 69 is straight and therefore is more easily inserted into and removed from the bottle or container body 10. This antenna 69 simply runs as a straight "peg" from the cap to within a few millimeters of the base of the bottle or container body 10. This antenna 69 also simplifies the operation because no pivoting, orientation, folding-out to fit the walls of the bottle or container body 10, etc. are needed. While antenna 69 is shown as being generally coextensive with the longitudinal axis of the respective bottle or container body 10, it is contemplated that a skewed orientation is also possible. In other words, antenna 69 would be angled relative to the longitudinal axis of the bottle or container body 10. In such an angled position, the antenna 69 may or may not intersect the longitudinal axis of the bottle or container body 10.

Alternatively, a corkscrew antenna could also be used. This antenna would be screwed into the bottle or container body 10, yet would be closer to the sidewalls than the straight antenna 69 without touching these sidewalls. Other possible antennas are, of course, also possible.

It is normally desirable to avoid coating the threaded finish of a beverage bottle, because this may affect the closure performance characteristics and because this can come in contact with the beverage and perhaps the mouth of the consumer. Although all of the coatings used in this invention are safe in contact with food, it is nonetheless desirable to restrict beverage contact to the main bottle material. Cap 20 covers the finish portion of bottle 10 and prevents the coating 9 from spreading to it.

Coating System and Operation

FIG. 3 shows one embodiment of a coating machine in accordance with this invention, which enables continuous, economic coating of the bottles. In view of the fact that bottles are inexpensive, mass produced, and often single use packages, it is important to arrive at an embodiment which provides a very low cost operation, is compact (because preferred location is beside a bottle blow molder), and is suitable for mass production (i.e. preferably continuous rather than batch processing).

Figure 7:
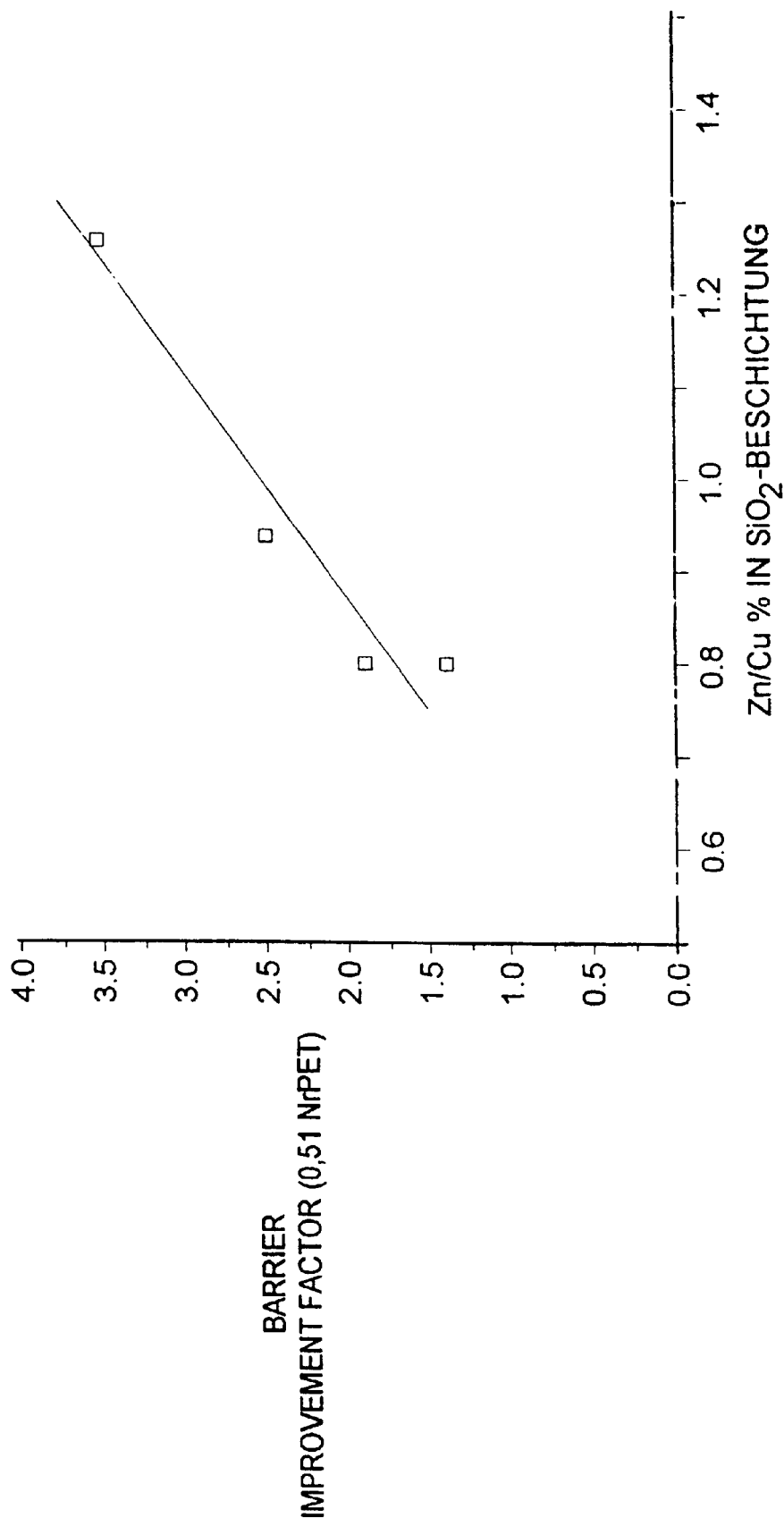
FIG. 7 is a graph showing improvements in gas barrier factor with increasing content of Zn or Cu.

In FIG. 3, the sequence of operation of the present invention is illustrated. Bottles or container bodies 10 will move through the various stages A through H. Initially, the bottles are supplied via conveyor 39 to a loading/unloading station 40. The bottles or container bodies 10 can be fed immediately from a forming machine 29 to the coating system. This forming machine includes a blow molding machine, injection molding machine, extrusion molding machine or any other known machine for forming container bodies or bottles 10. As will be described below with reference to FIGS. 7A–7C, the surface of a PET bottle, for example deteriorates over time. If the container bodies or bottles 10 are quickly coated after being formed, then potential obstructions to improved adhesion on the surface of the bottles or container bodies 10 are absent.

From conveyor 39, an operator can manually move or other suitable equipment can automatically move the bottles or container bodies 10 to the loading/unloading station 40. The conveyor 39 can feed bottles from a molding machine or any other upstream process.

At the loading/unloading station 40, the bottles or container bodies 10 are placed into or removed from a holder 41. This holder can have open interior or it can have segmented sections for receiving individual bottles 10. The arrangement of the holder 41 will be discussed in more detail below. The holder 41 used in FIG. 3 has four bottles in two rows for a total of eight bottles. Of course, this configuration could be modified so as to meet the needs of the system.

The holder 41 with the loaded bottles or container bodies 10 can be manually or automatically moved from the loading/unloading station 40 at stage A to the tool station 42 at stage B as noted above. The operation of this tool station 42 will be explained in more detail below with reference to FIG. 4. At this tool station 42, an antenna 30, cap 20 and an air-displacement collar 60 can be inserted into or removed from the bottles or container bodies 10. The cap 20, antenna 30 and collar 60 will be collectively designated as "tools". The tools as well as the holder 41 should be made of a non-gassing (low-absorbent) material whose surface cannot damage the surface of the coated or uncoated bottles or container body 10.

From the tool station 42 at stage B, the holder 41 with the bottles or container bodies 10 can be manually or automatically moved into the evacuation cell 43 at stage C. Some door, air lock or other feature is provided for enabling a vacuum to be formed within the evacuation cell 43. As will be explained in more detail below, the displacement collar 60 which had previously been applied to the bottles or container bodies 10 can be removed or reapplied in the evacuation cell 43. Also, a vacuum is either created or released in this evacuation cell 43 as will be described below.

From the evacuation cell 43, the holder 41 and bottles or container bodies 10 move into the loading/unloading table 44 at stage D. Loading of the bottles from holder 41 to bottle-carrying bars 51 is carried out on this table 44. Also, the bottles or container bodies 10 are unloaded from the bottles carrying bars 51 back into the holder 41 as will be described in more detail below.

When the bottles or container bodies 10 are mounted on the bottle-carrying bars 51 at stage D, they are then passed to the degassing and pretreatment sections 45 and stage E. The antenna 30 which can be within the interior of the bottles or container bodies 10 will be oriented by a magnet 46 in the degassing and pretreatment sections 45. The bottles or container bodies 10 have their longitudinal axes generally vertically aligned when in the degassing and pretreatment sections 45 of stage E.

From the degassing and pretreatment sections 45, the bottles or container bodies 10 on the bottles carrying bars 51 will move to the base coating section 47 at stage F. Then the bottles or container bodies 10 will move the sidewall coating section 48 at stage G. It should be noted that the bottles or container bodies 10 move from a generally vertical orientation in stage F to a generally horizontal orientation in stage G. This arrangement will be described in more detail below. From stage G, the bottles return to the loading/unloading table 44. The bottles or container bodies 10 are removed from the bottle-carrying bars 51 and reinserted into the holders 41. The holders 41 are then moved through the evacuation cell 43 at stage C to an intermediate holding position 49 at stage H.

Now after this general description, a more detailed description of the arrangement of FIG. 3 will now be given. First, the bottles or container bodies 10 are loaded into holder 41 at stage A as noted above. An operator can manually insert the tools, cap 20, antenna 30 and collar 60, onto the bottles or container bodies 10 or this step can be automatically carried out with appropriate equipment. This operation is carried out at the tool station 42 at stage B.

When the holders 41 and bottles or container bodies 10 are moved into the evacuation cell 43 at stage C, a vacuum will be created in this cell 43. The collar 60 previously applied at tool station 42 during stage B will be used to evacuate the interior of the bottles or container bodies 10 prior to the evacuation of pressure from cell 43. The purpose of collar 60 is reduce the amount of air brought into the evacuation cell 43. Together with the holder 41 into which bottles or container bodies 10 tightly fit, the pre-evacuation of the containers or bottles 20 reduces the amount of air which must be evacuated from the cell 43. In other words, the bottles or container bodies 10 tightly fit into the holder 41. This holder 41 tightly fits within the walls of the evacuation cell 43 in order to minimize the amount of air exterior of the containers or bottles 10.

Before or during insertion of the holder 41 with the bottles or container bodies 10 into the evacuation cell 43, the collar 60 is utilized to remove air from the interior of the bottles or container bodies 10. Therefore, the vacuum system for evacuating cell 43 need only evacuate the little amount of air existing in the cells exteriorly of the containers or bottles 10. Therefore, the vacuum system capacity can be reduced. This is an important economic consideration in view of the low operating pressure of the vacuum cell 50. This also helps to prolong the life of the vacuum system and helps to minimize the amount of energy consumed with the instant system.

From the evacuation cell 43 at stage C, the holder 41 with the bottles or container bodies 10 is moved to the loading/unloading table 44 at stage D. This loading/unloading table 44 is within the vacuum cell 50. The vacuum cell 50 and the evacuated cell 43 are both connected to a conventional vacuum system (not shown). When the evacuation cell 43 reaches the appropriate pressure, various steps are undertaken including opening of door 55 to permit entry of the holder 41 with the bottles or container bodies 10.

Within the vacuum cell 50, the bottles or container bodies 10 are degassed and pretreated in section 45 at stage E. This degassing at stage E can take up to sixty seconds, for example. It should be noted that degassing of the containers or bottles 10 actually starts in the evacuation cell 43 at stage C. The degassing is completed during the pretreatment in section 45 of stage E. The bottles or container bodies 10 are moved out of the holder 41 at the loading/unloading table 44 and onto bottle-carrying bars 51 which will be described in more detail below. The bottles are moved from the loading/unloading table 44 area in stage D to the subsequent stages within the vacuum cell 10 by movement of the bottle-carrying bars 51.

While a conveyor arrangement will described below for moving these bottlecarrying bars 51, it should be appreciated that many different arrangements could be used in order to convey the bottles or container bodies 10 through the vacuum cell 50.

In the degassing and pretreatment sections 45, orienting magnets 46 can be used to orient the antennas 11 or 30 as desired, if present. The antennas could be stationary relative to a certain point on the container bodies or bottles 10 or can be movable relative to the bottles or container bodies 10. In the degassing and pretreatment section 45 at stage E as well as in the downstream base coating section 47 of the stage F, the bottles or container bodies 10 have their longitudinal axes vertically oriented.

In the pretreatment loading/unloading table 44 area at stage D or in the degassing and pretreatment section 45 of stage E, heating of the bottles or container bodies 10 can be carried out if appropriate. At these stages D or E or throughout the vacuum cell 50, radiant or infrared heaters (not shown) could be provided such that the bottles or container bodies 10 would be at an appropriate temperature. For example, this temperature could be ambient to 60° C.

Apart from the bottles or container bodies 10 being at an appropriate temperature to facilitate degassing, the antennas 11 or 30 with the container bodies can be used to accelerate the degassing as has previously been noted. In particular, either RF or HR energy is applied to the internal antenna 11 or 30. Alternatively, as noted with regard to FIG. 1, a coating cell antenna 14 can be provided. DC/RF/HF energy can be applied to this coating cell antenna 14 or from an infrared source located near the bottle surface 6. All of these features can accelerate degassing.

The coating process is carried out in two parts. First, there was the previously noted base coating section 47 at stage F. Then the sidewall coating section 48 at stage G completes coating of the bottles or container bodies 10. In this base coating section 47, the bottom or base of the bottles or container bodies 10 are coated. Then as will be described in more detail below, the longitudinal axes of the bottles are changed from the vertical to a horizontal orientation. This is achieved by increasing space between bottle bars 51. As will be described below with reference to a fast-moving chain 53 and a slow-moving chain 52, this reorientation of the bottles or container body 10 can take place. Throughout their vertical and horizontal orientations, the bottles or container bodies 10 are close to each other to give best utilization to the evaporators or source 1, but they do not touch. The bottles in the horizontal orientation are then moved through a sidewall coating section 48 at stage G. As the bottles move through the section, they can be rotated about their longitudinal axis.

The bottles or container bodies 10 can be coated throughout movement in the sidewall coating section 48 or only in a portion thereof. The distance of the coating section 48 over which the bottles are coated can be influenced by the amount of coating desired to be deposited on the bottles. For example, various sources 1 can be provided in the vacuum cell 50 for supplying the coating vapor to the bottles or container bodies 10. If a thicker external coating is desired, then more of the sources 1 could be activated as opposed to when a thinner coating is desired. Of course, other criteria can be modified in order to influence the thickness of the coating on the exterior of the bottles or container bodies 10.

Similarly to the pressure in the degassing and pretreatment section 45 of stage E, the pressure in both the base coating section 47 and the sidewall coating section 48 of stages F and G can be $2\times10^{-4}$ mbar and can be in the range of 1 to $5\times10^{-4}$ mbar. It is contemplated that the base coating in stage F will take 1–15 seconds but can be in the range of up to 30 seconds. The sidewall coating in stage G can take less than 30 seconds but be in the range of 2–120 seconds. The bottles can rotate from 1–300 revolutions per minute, but the upper limit depends only on practical mechanics. Typically, the bottles would rotate from 1 to 100 revolutions per minute.

Within the coating cell 50, an evaporator system can be provided. This evaporator system was described with reference to FIG. 1 and will also be described in more detail with reference to FIGS. 6A and 6B. In particular, evaporators or source 1 are provided in order to provide the coating which will be deposited on the exterior of the bottles or container bodies 10.

Figure 6B:
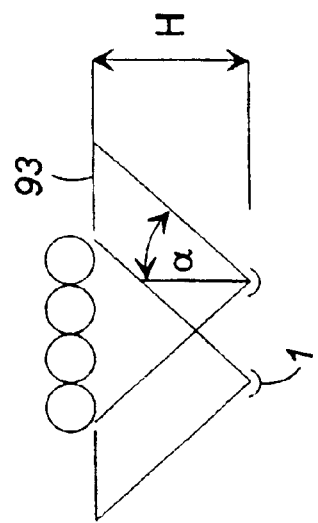
FIG. 6B is a side sectional view taken along line VI—VI of FIG. 6A.
Figure 6A:
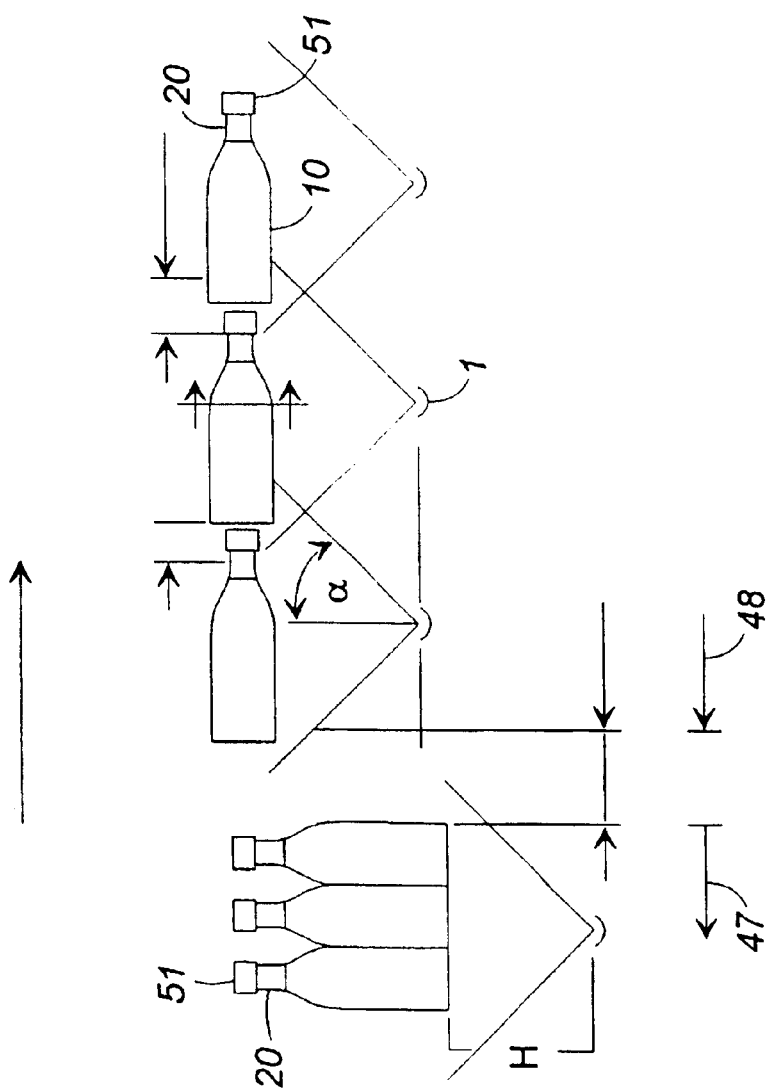
FIG. 6A is a schematic illustration of bottles moving past plasma-making and coating sources.

The evaporators can be arranged in rows so that the evaporator fluxes overlap their paths, giving an even longitudinal deposition rate R. This rate can be 3 nm/s and be in the range of 1–50 nm/s. The angle of contact a which was previously discussed therefore only applies to row ends and to the row cross sections where there is no overlap. This angle of contact a is indicated in FIGS. 6A and 6B and can be 30° or at least in the range of 30–60°, for example.

However, as previously noted this angle should not normally be greater than 70.

It is desired that the evaporators layout must result in a minimum number of evaporators or sources 1 with the most effective use thereof. In other words, material loss should be minimized. The presentation of bottle rows to the evaporator or source 1 can be four in a row as indicated in FIG. 3 but this number can be varied as desired. It is merely desired that the evaporator or source 1 utilization will be optimized.

As will be described below for FIGS. 6A and 6B, dust screens or shields 93 can be provided. These shields or dust screens should be removable and easily cleaned. They will catch particles from the evaporator or source 1 which are not adhering to the bottle surface.

In order to avoid the need for switching off the evaporators or sources 1 during short cycle pauses, provision can be made for swing covers or similar covers to collect coating vapors during non-coating periods of the cycle. This will reduce the dust coating of the internal coating cell. Automatic function controls and automatic detection of malfunctioning evaporators or sources 1 can also be provided. It is estimated that the parameters specified will result in a coating thickness of about 50 nm. On this basis, the evaporation rate is estimated as follows. With the weight of the bottle being 30 grams and the PET thickness being 0.35 mm, the coating thickness can be 50 nm. Therefore, the proportion coating to PET (V/V) will equal 0.00014. The Si proportion of $SiO_2$ (W/W) will equal 0.467. The density of the $SiO_2$ will be 2.5 with the density of PET being 1.3. Therefore, the weight of Si of coating will be 0.004 g/bottle. At about 3,000 bottles per hour, the Si evaporated for bottle coating only (not including losses) will be about 11.5 g with about 30 g/h including the total losses.

As has been described with reference to FIG. 1, the distance between the evaporator or source 1 and the bottle surface (H) can be 0.5 and be in the range of 0.1 to 2 m. It should also be possible to remove sources 1 from the vacuum cell 15 for inspection and/or maintenance without releasing the coating or vacuum. A tandem evaporator system operating through vacuum locks is one possibility. In view of this, no automatic material feed to the evaporators would be needed. Of course, such an automatic material feed could be used, if so desired. The evaporating function must be monitored by instruments and can be visible from outside of the vacuum cell 50 by means of sight glasses, for example.

After moving through the sidewall coating section 48 at stage G, the bottles 10 will reenter the holder 41 at the loading/unloading table 44. This arrangement will be described in more detail with regard to FIG. 4. From the loading/unloading table 44 at stage D, the holders 41 with the reinserted bottles or container bodies 10 will back into the evacuation cell 43 at stage C. Prior to moving into this evacuation cell 43, the collars 60 will be placed on the containers at stage D.

When the holder 41 and bottles or container bodies 10 are reintroduced into the evacuation cell 43, the vacuum can be released. Then, the holder 41 containing the coated bottles or container bodies 10 will exit the evacuation cell 43. The holder 41 with the bottles 10 can then be slid to the intermediate holding position 49. At this position, the entry to the evacuation cell 43 will be clear such that another loaded holder 41 with uncoated bottles or container bodies 10 can be quickly reinserted into the evacuation cell 43. This helps to keep the continuous operation of the coating system. After evacuation cell 43 is reloaded, the holder 41 can return to stage B where the tools are automatically or manually removed. In other words, the cap 20, antenna 30 and collar 60 will be removed from the bottles or container bodies 10. Then, at the loading/unloading station 40 at stage A, the coated bottles or container bodies 10 can be removed from the holder 41 and returned to the conveyor 39 for subsequent processing. New uncoated bottles or container bodies 10 can be placed into the emptied holder 41 enabling the described cycle of operation to repeat.

When bottles 10 and holder 41 are viewed separately, bottles 10 first pass through stages A to G, and then return through stages C to H to A. There are two holders 41, and these first pass through stages A to G, and return by passing through stages C to H to A. There are sufficient sets of tools to cover all bottles in stages B through H. The tools are applied at stage B and return to stage B having passed through all the stages B to H.

Stages D, E, F, G are housed in a vacuum cell 50. Bottles 10 are gripped by bottle bars 51 and processed through the vacuum cell 50 by conveyor chains, one slow moving chain 52 and one fast moving chain 53. The slow moving chain 52 pushes the bottle bars 51 in a closely packed arrangement, during the cycle of operations when the bottles 10 are held in vertical position (for degassing and pretreatment at stage E and base coating at stage F) and the fast moving chain 53 pushes the bottle bars 51 with greater bar-to-bar spacing while the bottles 20 are in a horizontal position (for sidewall coating at stage G). The bottle bars 51 run in carrier rails 54 which firmly locate and carry the bottle bars 51 as will be described in more detail with reference to FIG. 5A.

The evacuation cell 53 is equipped with conventional mechanized doors 55 which open/close to enable holder 41 to enter/exit. A ceiling door 55a in FIG. 5 allows the collar 60 to be removed and/or reapplied) by conventional means prior to the holder 41 moving into the main section of vacuum cell 50. The compartment above the evacuation cell 53, where the collar 60 is held after removal, is part of vacuum cell 50, and both this compartment and the main part of vacuum cell 50 are permanently under vacuum. Evacuation cell 43 is evacuated to enable holder 41 to enter vacuum cell 50 and is returned to normal pressure to allow holders 41 to exit the coating system.

Bottles 10 are conveyed conventionally along conveyor 39 to the coating machine (preferably directly from the blow molder), and to the bottle palletizing system after coating.

Figure 4:
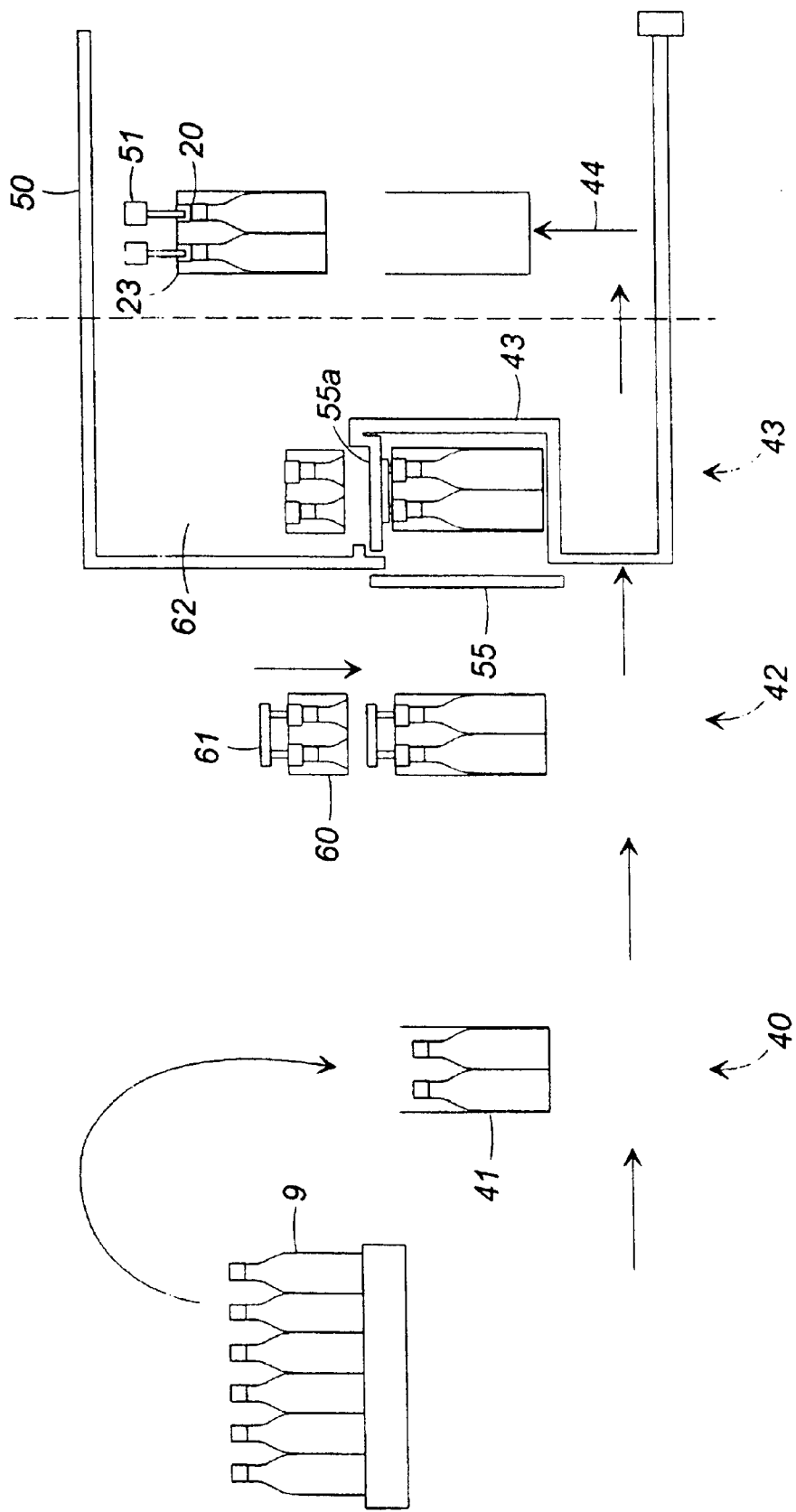
FIG. 4 is a schematic illustration of the handling of bottles, holder, caps, antennas, air-displacing collars of the present invention.

FIG. 4 shows the handling of bottles 10 and tools. Bottles 10 enter a holder 41 at stage A. Bottles tO fit tightly into cavities within the holder 41 to reduce the air gaps as much as possible, as this in turn reduces vacuum pump duty. At stage B. a collar 60 is applied to reduce the air gaps around the necks of bottles 10 and the antenna 30 and cap 20 are fitted onto bottle 10. The caps 20 are screwed onto the bottles 10 by a series of screw drivers which are part of a tool applicator 61. At stage C, the holder 41 enters the evacuation cell through door 55. Overhead door 55a opens to allow collar 60 to be lifted off and stored in a storage compartment 62, within the vacuum cell 50. At stage D, the holder 41 is elevated to the bottle bars 51 which pick up the bottles 10 by means of the snap-in connector 23 on the caps 20. The bottle bars 51 now progress through the coating stages D to G.

After coating, the holder 41 is elevated at stage D to the bottle bars 51 and the bottles 10 are released into holder 41. The holder 51 returns to the evacuation cell 43, where the collar 60 is reapplied, and vacuum is released. Holder 41 exits to stage B, where the tool-applicator 61 descends, grips caps 20 by the snap-in connector 23, unscrews caps 20 and lifts caps 20, antennas 30 and collar 60 as a single unit, the collar 60 being lifted off by the caps 20, which lock in its underside. The tool-applicator 61 and the quick release, screw driver devices, comprise conventional technology and will not be described further.

Figure 8B:
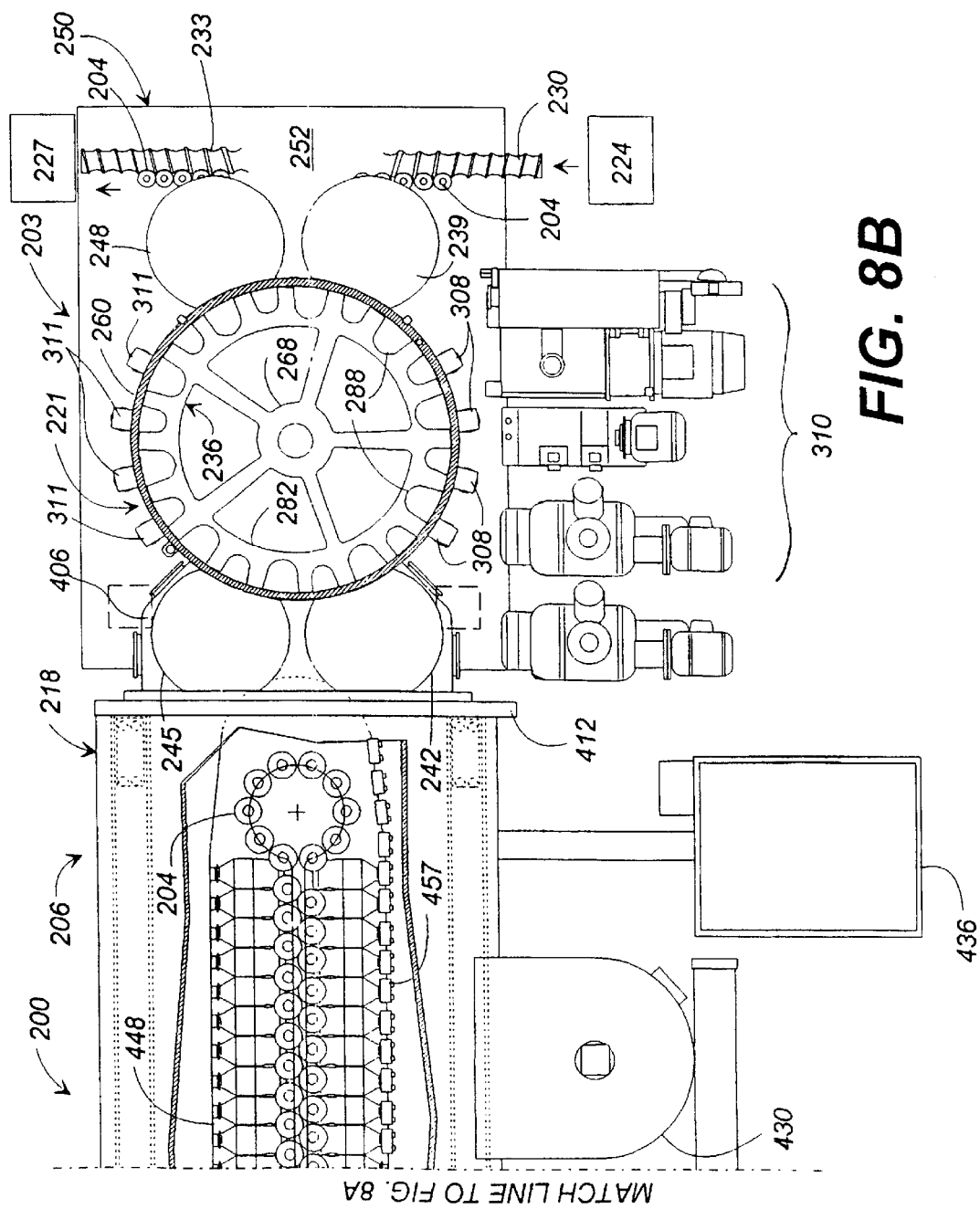

FIG. 5A shows details of the bottle bars, bottle turning and bottle conveying. Bottle bars 51 hold a plurality of bottles 10 in a row. In FIG. 5A, four bottles 10 are shown, as an example only. A bottle drive shaft 70 on which worm gears 71 are fitted, runs inside the bottle bars 51, and is suspended by bearings 72 at each end of bottle bar 51. The cap 20 acts as means for gripping the neck of the bottle or container body 10 to help hold it on bottle bar 51. As seen in FIG. 8B, this cap 20 also covers the neck and/or threads of the container body or bottle 10 whereby coating of this area of the container body can be prevented. The bottle drive shaft 70, also shown in FIG. 5B, is driven by bevel gears 13, and rotates by rotating the snapin connectors 23 which are fitted with a screw driver end piece (not shown) to thereby act as means for rotating the container bodies or bottles 10 during transport through the vacuum cell 50. The bottle bar 51 is fitted at each end with carrier bars 74 in which it is free to swivel, due to bush bearings 75. The carrier bars 74 are fitted with carrier wheels 76 which run in a pair of carrier rails 54. The bottle bars 51 are conveyed by means of a drive chain 77, to which a pall-finger 78 is attached which in turn impinges upon an extension arm 79 on carrier bars 74. The drive chain 77 is attached to a main shaft 80 which is driven by conveyor motor 81. A bottle rotation motor 82 drives a bottle rotation sprocket 83 which is free to slide up/down main shaft 80 by means of bearing bushes 84. Bottle rotation sprocket 83 drives bottle rotation chain 85 which in turn drives the bevel gears 73.

The bottle bars 51 are attached to a guide wheel 90 which runs in a guide rail 91. This guide rail 91 is able to turn the bottle bar 51 from a position holding bottles 10 vertically (as shown) to a position holding bottles horizontally by means of guiding the guide wheel up a ramp 92 at the appropriate part of the conveying cycle. This switch from a vertical orientation to a horizontal orientation occurs between stages F and G. When the bottles or container bodies 10 are horizontally oriented, the bottles or container bodies 10 continue to rotate without interruption by means of bevel gears 73 while the bottle rotation sprocket 83 moves up the main shaft 80 to accommodate the new position of the bevel gears 73. Dust screens 93 previously noted protect the main parts of the drive system.

FIG. 6A is a view of bottle motion past source 1, both for base coating and sidewall coating. Bottles 10 and caps 20 are held vertically in the base coating section 47 by bottle bars 51 which continuously rotate both the bottles 10 and caps 20. After base coating the bottles 10 are turned to horizontal position for sidewall coatings as quickly as possible (i.e. with minimum gap between base coating section 47 and sidewall coating section 48). The bottles are continuously rotating throughout the conveying cycle. Bottle bars 51 are designed compactly to minimize spacing between bottle rows in horizontal position. Sources 1 are positioned so as to minimize the number of sources 1 needed and according to the criteria discussed in conjunction with FIG. 1, but with some overlap as shown in FIG. 6B to ensure full coating coverage. Dust screens 93, which are easily removable for cleaning, protect the machine parts from those deposits from source 1 which do not impinge on bottle 10. Strip brushes with dust screens are used to separate, whenever possible, the main coating cell of vacuum cell 50 from the chains, motors, etc. used for transporting the bottle bars 51.

FIG. 9 is a graph showing improved barrier effect showing the importance of coating composition to gas barrier. A small change in Zn, Cu or Mg composition can have a large effect on the barrier enhancement.

High Speed, High Volume System for Coating Plastic Container Bodies Overview

A high speed, high volume system 200 for coating plastic container bodies with an inorganic oxide barrier coating is illustrated in FIGS. 8A–16. This high speed, high volume system 200 does not incorporate a source of bias energy such as from an RF or HF source in the previously described embodiments, or utilize in-bottle antennas. This high speed, high volume system 200 is useful, however to apply the same coatings with the same materials to the same type of plastic containers as with the system previously described and illustrated in FIG. 1. In addition, this high speed, high volume system 200 operates under substantially the same parameters as the previously described system with the exception of the use of bias energy in that system.

Generally described, the high speed, high volume coating system 200 comprises a continuous and automatic container feeder 203 for delivering plastic container bodies 204, such as PET bottles, to a vacuum cell 206 which houses a continuous and automatic conveyor 209 and a source 212 of coating vapor 215. The source of 212 of coating vapor is also referred to as an evaporator system. These basic components are described in more detail below.

Container Feeder

The vacuum cell 206 includes a housing 218 which is capable of maintaining a vacuum therein and the container feeder 203 is at least partially rotatably engaged in a port 221 at one end of the vacuum cell housing. The container feeder 203 is a rotary system which continuously and automatically supplies uncoated plastic container bodies from a source 224 of plastic container bodies through the port 221 in the vacuum cell housing 218 to the conveyor 209 inside the vacuum cell 206 while the vacuum cell maintains a vacuum inside the vacuum cell housing. The container feeder 203 supplies the plastic container bodies 204 to the vacuum cell 206 at a high speed and a high volume. The container feeder 203 supplies and the coating system 200 can coat plastic container bodies at a rate up to 60,000 containers per hour, but would normally coat at a rate necessitated by a link-up to the bottle-making system, currently in the range of 20,000 to 40,000 bottles per hour. In addition, the container feeder 203 automatically and continuously retrieves coated plastic container bodies 204 from the conveyor 209 inside the vacuum cell 206 and transports the coated plastic container bodies to a location outside of the vacuum cell such as a beverage packaging line 227.

A first screw conveyor 230 continuously and automatically transports the uncoated plastic container bodies 204 from the source 224 of container bodies into the container feeder 203 and a second screw conveyor 233 automatically and continuously transports the resulting coated plastic bodies from the container feeder toward the beverage packaging line 227. This is best illustrated in FIGS. 8A and 8B. The container feeder 203 includes a feed wheel 236 rotatably mounted in the vacuum cell port 221 for automatically and continuously feeding the uncoated plastic container bodies 204 into the vacuum cell 206 and automatically and continuously transporting the coated plastic container bodies out of the vacuum cell. In addition, the container feeder 203 includes a first exterior rotary feeder 239 for automatically and continuously feeding the uncoated plastic container bodies 204 from the first screw conveyor 230 to the feed wheel 236 and a first interior rotary feeder 242 for automatically and continuously feeding the uncoated plastic container bodies from the feed wheel to the conveyor 209. Likewise, the container feeder 203 also includes a second interior rotary feeder 245 for automatically and continuously feeding the coated plastic container bodies 204 from the conveyor 209 to the feed wheel 236 and a second exterior rotary feeder 248 for automatically and continuously feeding the coated plastic container bodies from the feed wheel to the second screw conveyor.

As best shown in FIGS. 8A, 8B, 9A and 9B, the container feeder 203 is mounted to a feeder frame 250 which comprises a large support plate 252 supported by four legs 254 secured to a hard surface 256 such as concrete. The support plate 252 of the feeder frame 250 forms the bottom of a feed wheel housing 260 which forms part of the vacuum cell port 221. The feed wheel housing 260 also includes a circular top plate 262 and a cylindrical side wall 264 extending between the feeder frame support plate 252 and the top plate. The feed wheel 236 is rotatably and sealingly disposed in the feed wheel housing 260.

Figure 11:
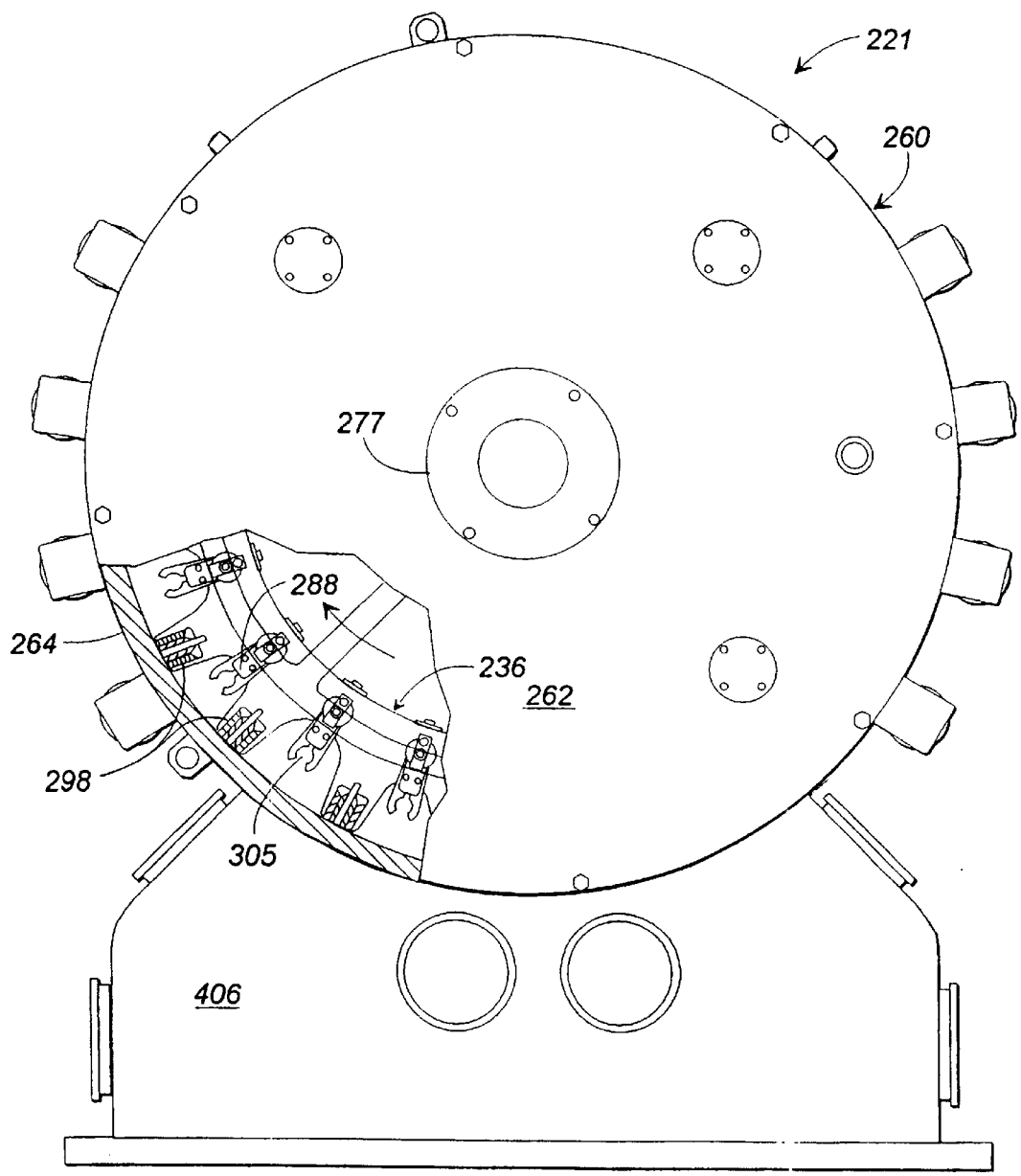
FIG. 11 is a partial plan view of the vacuum cell housing port and feed wheel of the coating system illustrated in FIGS. 8A and 8B.
Figure 12:
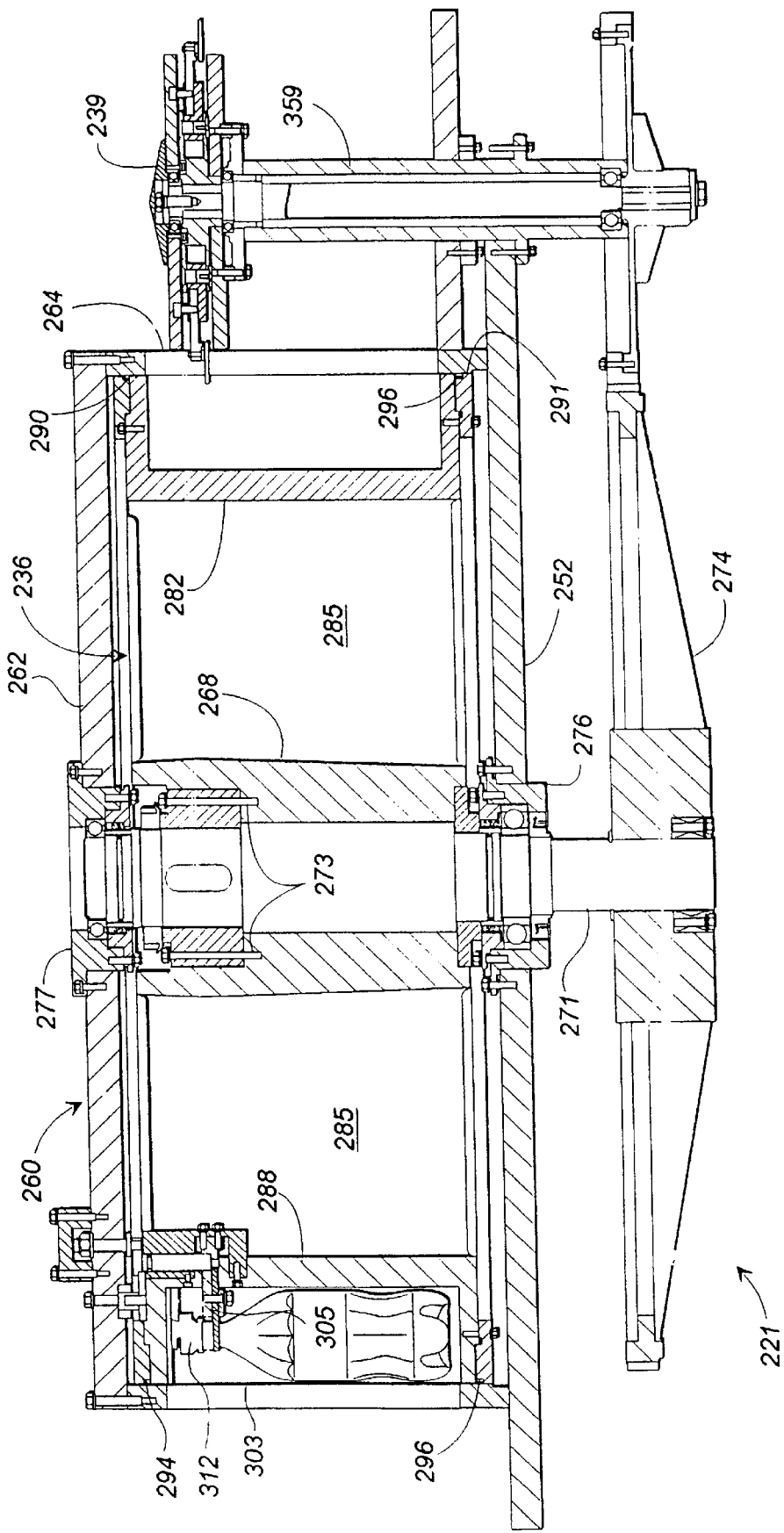
FIG. 12 is a partial sectional elevation view of the vacuum cell housing port and feed wheel is illustrated in FIG. 11.

As best shown in FIGS. 11 and 12, the feed wheel 236 includes a central hub 268 mounted to a shaft 271 with bolts 273. The shaft 271 extends vertically through a lower guide frame 274 beneath the feeder frame 250 and through a first bearing 276 in the feeder frame plate 252 to a second bearing 277 in the top plate 262 of the feed wheel housing 260. An electric motor, not shown, drives the feed wheel shaft 271 and rotates the feed wheel 236 in a clockwise direction as shown in FIG. 11. The feed wheel shaft 271 rotates in the first and second bearings 276 and 277.

The feed wheel 236 also includes a peripheral cylindrical structure 282 connected to the central hub 268 with spokes 285. The feed wheel 236 has a plurality of ports 288 spaced about the periphery 282 and opening transversely outwardly from the feed wheel. Each of the ports 288 in the peripheral structure 282 of the feed wheel 236 extends from an upper annular edge 290 of the peripheral structure to a lower annular edge 289 of the peripheral structure. The feed wheel 236, though rotatably mounted in the feed wheel housing, forms an tight seal between the peripheral structure 282 of the feed wheel and the interior of the cylindrical side wall 264 of the feed wheel housing 260. This seal prevents air from leaking into the vacuum cell 206 even while the feed wheel 236 is rotating and feeding plastic container bodies 204 into and out of the vacuum cell. This seal is formed by an endless gasket 294 extending slightly radially outwardly from a channel running along the upper annular edge of the peripheral structure 282, an endless gasket 296 extending radially outwardly from a channel running along the lower edge 291 of the peripheral structure, and a plurality of gaskets 298 extending from the upper endless gasket to the lower endless gasket between each port 288 in the peripheral structure. The vertical gaskets 298 extend radially outwardly from vertical channels in the peripheral structure 288 of the feed wheel 236 between the feed wheel ports 288. Each of the gaskets 294, 296, and 298 comprise strips of rubbery packing material which fit tightly against the interior of the cylindrical side wall 254 of the feed wheel housing 260. Suitable packing material is hard wearing material with low frictional characteristics, an example being a suitable grade of polytetrafluoroethylene.

Figure 9B:
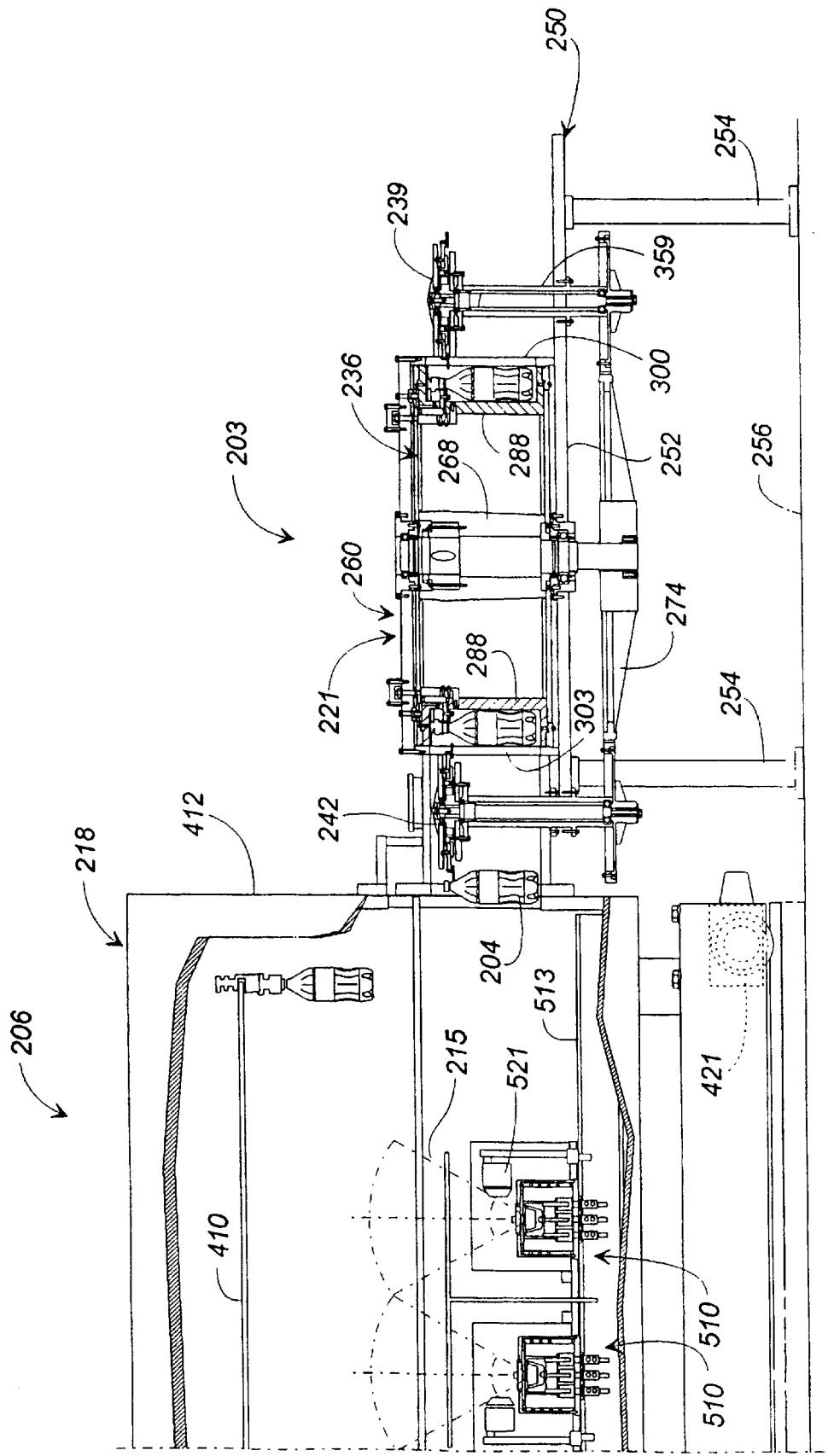

The ports 288 of the feed wheel 236 receive uncoated plastic container bodies 204 from the first exterior rotary feeder 239 and feed coated plastic container bodies to the second exterior rotary feeder 248 through an exterior opening 300 in the feed wheel housing 260 as shown in FIG. 9B. The ports 288 of the feed wheel 236 feed uncoated plastic container bodies 204 to the first interior rotary feeder 242 inside the vacuum cell 203 and receive coated plastic container bodies from the second interior rotary feeder 245 through another opening 303 in the feed wheel housing 260 facing the interior of the vacuum cell 206. This is best shown in FIG. 12. Clamps 305 are disposed in each of the feed wheel ports 288 for grasping the necks of the container bodies 204 while the container bodies are transported by the feed wheel 236.

Vacuum ports 308 are connected to the cylindrical side wall 264 of the feed wheel housing 260 between the openings 300 and 303 in the feed wheel housing 260 and are connected to vacuum pumps 310 which evacuate air from the feed wheel ports 288 as the feed wheel carries uncoated plastic containers 204 from the first exterior rotary feeder 239 into the vacuum cell 206. Therefore, when the feed wheel ports 288 are exposed to the vacuum inside in the vacuum cell 206, the feed wheel ports are substantially evacuated. Air feed ports 311 are connected to the feed wheel housing 260 between the second interior rotary feeder 245 and the second exterior rotary feeder 248 for supplying air to the ports 288 and the feed wheel 236 to repressurize the ports and coated containers 204 with air as the coated container bodies are transported from the second interior rotary feeder to the second exterior rotary feeder.

The uncoated plastic container bodies 204 are capped and sealed with caps 312 by a capper or capping device (not shown) and then partially evacuated as the feed wheel 236 transports the uncoated plastic container bodies from the first exterior rotary feeder 239 into the vacuum cell 206. The caps 312 have a structure similar to those described with regard to the embodiment illustrated in FIG. 1 and function to seal the threaded finish of the container body 204 from the coating vapors, to provide a method for attaching the container bodies to the conveyor 209, and to control the pressure inside the container body. The caps 312 fit tightly over the threaded opening or fitment of the plastic container bodies 204 and contain a ferrous metal element so that the plastic container bodies can be magnetically carried by the conveyor 209. Desirably, the plastic container bodies 204 contain enough air while traveling through the vacuum cell 206 so that the container bodies are pressurized compared to the surrounding environment inside the vacuum cell.

Figure 13:
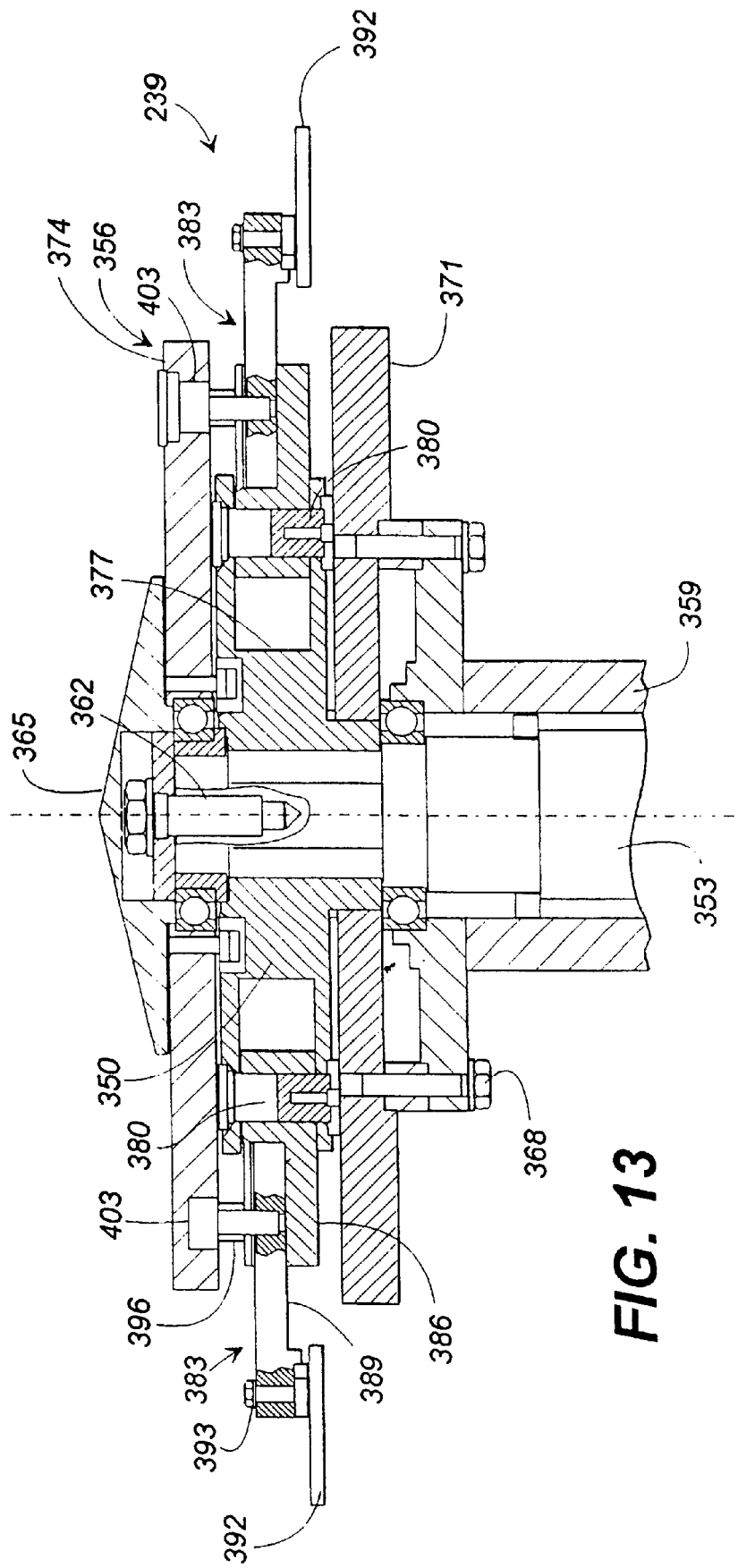
FIG. 13 a partial sectional elevation view of container body feeder which orms part of the coating system illustrated in FIGS. 8A and 8B.
Figure 14:
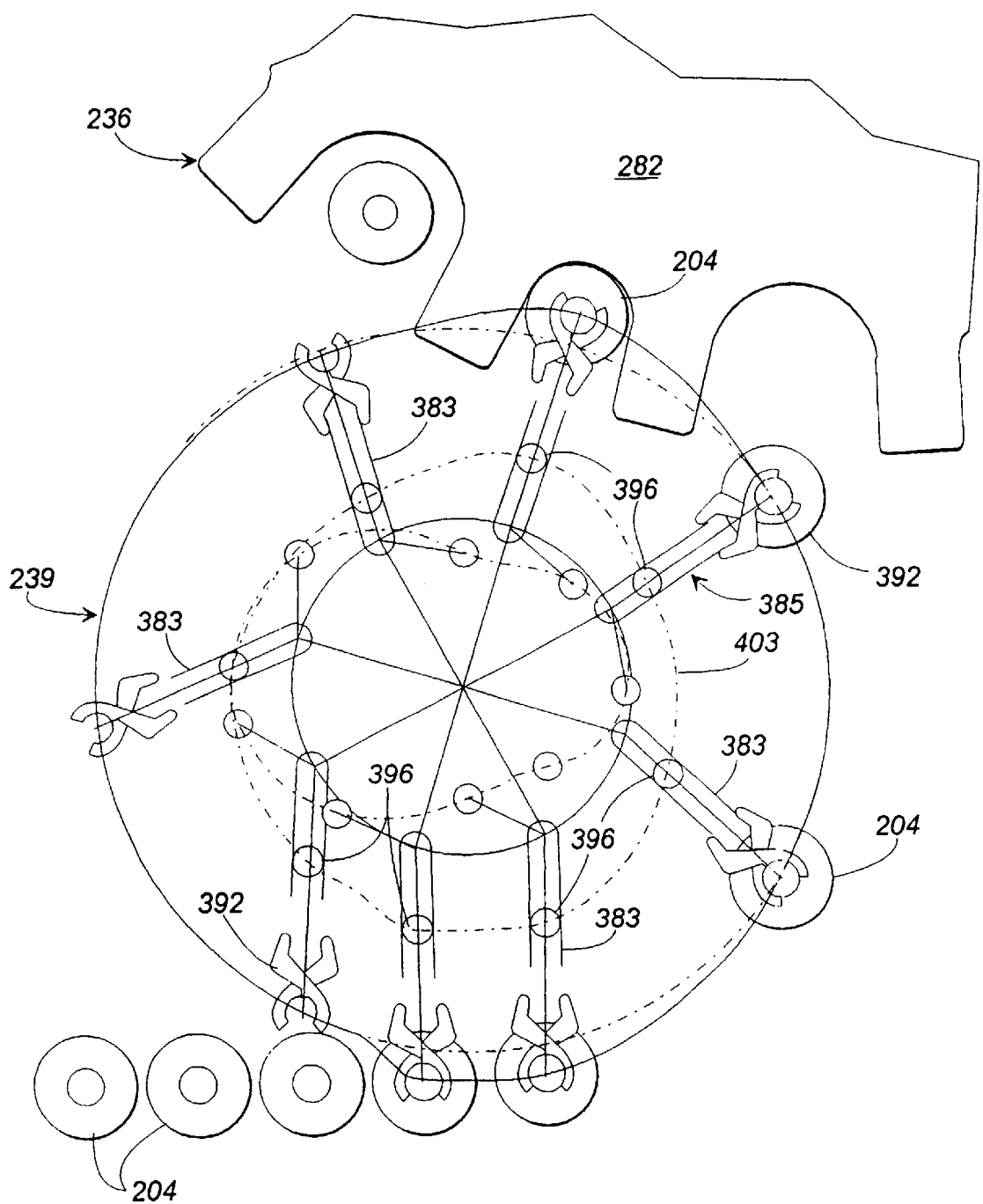
FIG. 14 is a partial plan view of the container body feeder illustrated in FIG. 13.

The first exterior rotary feeder 239 is rotatably mounted to the feeder frame 250 outside of the vacuum cell 206 between the first screw conveyor 230 and feed wheel 236. As best shown in FIGS. 13 and 14, the first exterior rotary feeder 239 comprises a rotatable hub 350 mounted on a shaft 353 driven by a motor synchronously with the feed wheel 236. The first exterior rotary feeder 239 also includes a stationary bearing 356 in which the hub 350 rotates. The shaft 353 connected to the hub 350 extends to the stationary bearing 356 through the lower frame guide 274 and support plate 252 of the feeder frame 250, through a cylinder 359 which mounts the stationary bearing to the support plate 252 of the feeder frame. A bolt 362 attaches a flange to the upper end of the shaft 353 and a cap 365 is secured to the flange above the stationary bearing 356. The stationary bearing 356 is mounted to the cylinder mount 359 with bolts 368.

The stationary bearing 356 includes a lower plate 271 mounted to the support cylinder 359 and an upper plate 374 spaced from the lower plate and mounted to the feed wheel housing 260. This is best shown in FIGS. 9B and 13. The hub 350 rotates between the lower plate 371 and the upper plate 374 of the stationary bearing 356 and has a radially facing annular channel 377. A plurality of pivot pins 380 are mounted vertically in the annular channel 377 and are spaced about the circumference of the hub 350. Container body handling arms 383 are pivotedly mounted to the pivot pins 380 and extend radially outwardly from the hub 350.

Each of the container body handling arms 383 includes a handle 386 pivotedly mounted to the pivot pins 380 and a reciprocable extension 389 slidably engaged with the handle 380 so that the reciprocable extension can extend radially outwardly and alternatively inwardly as the hub 350 rotates. Each of the arms 383 also includes a clamp 392 mounted to the distal end of the reciprocable extension 389 with a bolt 393. The clamps 392 are useful for grasping the neck of the container bodies and holding the container bodies while the arms carry the container bodies. Each reciprocable extension 389 includes a guide pins 396 mounted to the extension and extending upwardly engaging grooves or tracks 403 in the underside of the upper plate 374 of the stationary bearing 356. The tracks 403, through the guide pins 396, cause the extensions 389 of the arms 383 to reciprocate and move laterally. The tracks 403 are designed to direct the arms 383 as the feeder hub 350 rotates so that the arms reach out and grasp the plastic container bodies 204 from the first screw conveyor 230 and then insert the container bodies into the feed wheel ports 288. The clamps 305 extending from the feed wheel 236 hold the necks of the container bodies 204 more tightly than the clamps 392 of the first exterior feeder 239 and pull the container bodies away from the first exterior feeder as the arms of the first exterior feeder rotate past the feed wheel. The extensions 389 of the first extension feeder arms 383 reciprocate inwardly and shift laterally as necessary to avoid undesirable collisions.

The first interior rotary feeder 242, the second interior rotary feeder 245, and the second exterior rotary feeder 248 have the same structure and function as the first exterior rotary feeder 239. The second exterior rotary feeder 248 is also mounted to the feeder frame 250 and the feed wheel housing 260 and is positioned between the feed wheel 236 and the second screw conveyor 233. The first interior rotary feeder 242 is mounted to the feeder frame 250 in a portion 406 of the vacuum cell housing 218, referred to as the interior feeder housing, extending between the feed wheel housing 260 and the conveyor 209. The first interior rotary feeder 242 is also mounted to the feed wheel housing 260. The first interior rotary feeder 242 is positioned so that the arms 383 of the first interior rotary feeder grasp the container bodies 204 from the ports 288 and feed wheel 236 as the container bodies enter the interior feeder housing 406. The arms of the first interior feeder 242 transport the uncoated container bodies 204 to the conveyor 209. The second interior rotary feeder 245 is positioned adjacent the first interior rotary feeder 242 in the interior feeder housing 406 and is mounted to the feeder frame 250 and the feed wheel housing 260. The arms 383 of the second interior rotary housing 245 grasp the coated container bodies 204 from the conveyor 209 and insert the coated container bodies into the ports 288 of the feed wheel 236.

Vacuum Cell

The vacuum cell 206 includes the vacuum cell housing 218 and is capable of maintaining a very high vacuum in the vacuum cell housing 218. Desirably, the coating process is run inside the vacuum cell housing 218 at a pressure within the range from about $1 \times 10^{-4}$ mbar to about $50 \times 10^{-4}$ mbar, and more preferably from bout about $2 \times 10^{-4}$ mbar to about $10 \times 10^{-4}$ mbar. The vacuum cell housing 218 includes the feed wheel housing 260 and the interior feeder housing 406, both of which form the vacuum cell port 221, and also includes a coating housing 409 which forms the remainder of the vacuum cell housing. The vacuum cell housing 218 is made of a material such as stainless steel which can withstand the high vacuums produced inside the housing. The coating housing 409 includes an elongate cylinder 410 extending between a forward end plate 412 and a rearward end plate 415. Each of the components of the vacuum cell housing 218 are joined with an air tight seal that can withstand the high vacuum inside the housing. The interior feeder housing 406 is removably attached to the forward end plate 412 of the coating housing 409.

The coating housing 409 is mounted on a frame 418 disposed beneath the coating housing. The coating housing frame 418, in turn, is mounted on wheels 421 on a track 424 fixed to the hard surface 256. The coating housing 409 can therefore be separated from the port 221 by disconnecting the port from the coating housing and sliding the coating housing along the track 424. This provides access to the equipment inside the vacuum cell 206 for maintenance and repair. A motor 425 moves the coating housing 409 along the track 424.

A housing 427 containing apparatus for removal of the internal equipment from the coating housing 409 and is attached to the rearward end plate 412 of the coating housing. A pair of diffusion pumps 430 connected to the coating housing 409 are connected in series with a vacuum pump 433 for maintaining the vacuum inside the vacuum cell 206. A cryogenic cooler 436 positioned outside the vacuum cell 206 cools a condenser 437, shown in FIG. 10, inside the vacuum cell 206. The condenser 437 condenses and freezes any water inside the vacuum cell 206 to reduce the amount of water that has to be removed by the vacuum pumps.

Conveyor

Figure 10:
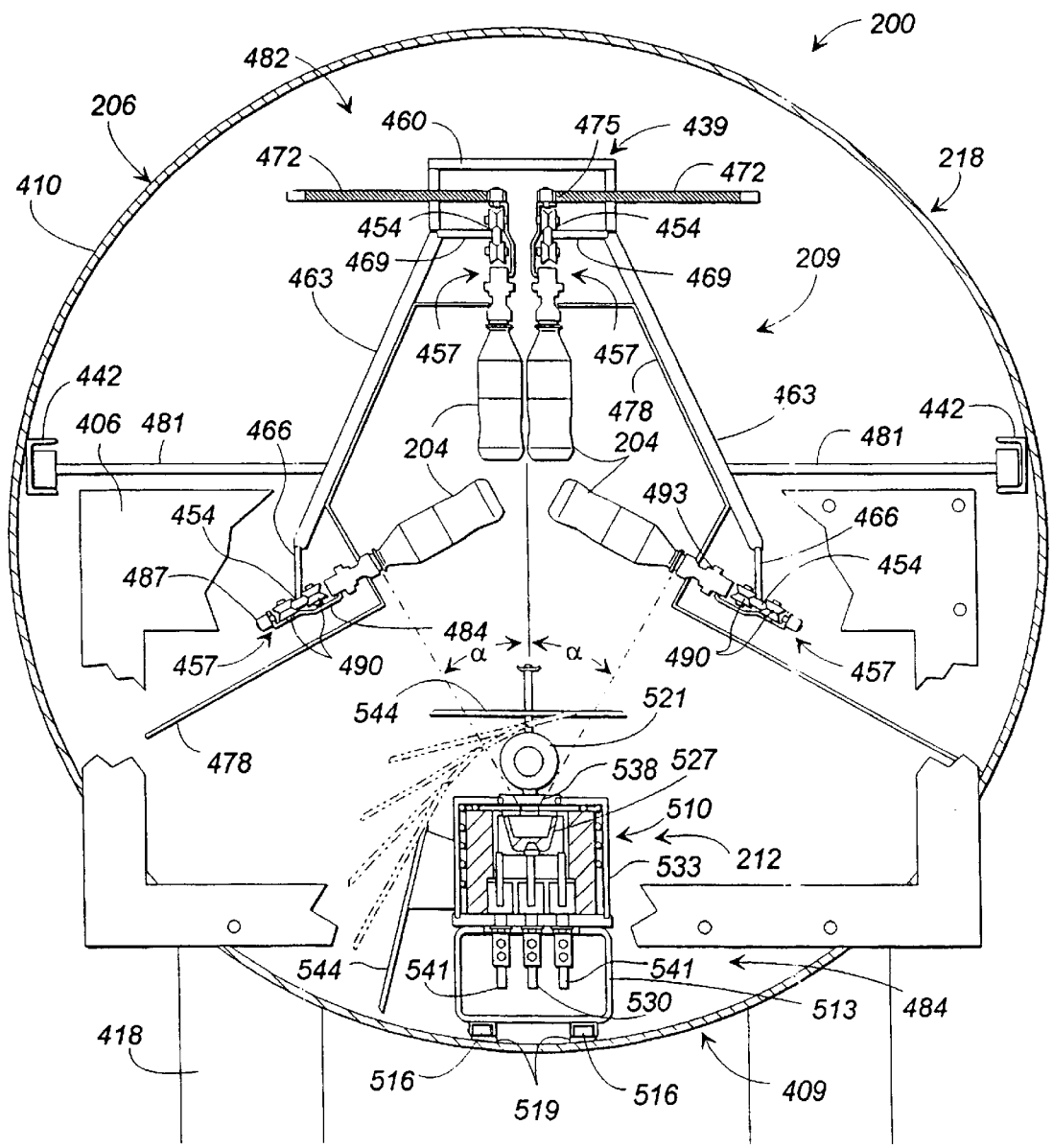
FIG. 10 is a partial end elevation view exposing the interior of the vacuum cell.

The conveyor 209, best shown in FIG. 10, includes a generally A-shaped frame 439 slidably mounted along rails 442 extending longitudinally along opposite inner sides of the coating housing cylinder 410. The conveyor frame 439 is mounted above the coating vapor source 212 so that the conveyor 209 carries the plastic container bodies 204 above the coating vapor source. The conveyor frame 439 forms an endless double loop track 445 which reassembles a clothespin configuration. The endless double loop track 445 of the conveyor includes an outer, lower loop 448 and an inner, upper loop 451. An endless rail 454 runs along the lower and upper loops 448 and 451. Container holders 457 travel along the endless rail 454 to carry the container bodies over the coating vapor source 212 four times, twice with the sides of the container bodies facing the coating vapor source and twice with the bottoms of the container bodies facing the coating vapor source. The sides of the container bodies 204 face the coating vapor source when traveling along outer lower loop 448 and the bottoms of the container bodies face the coating vapor source when the container bodies are transported along the inner, upper loop 451. FIGS. 8A and 8B do not show all of the container holders 457 for illustrative purposes. The container holders 457 desirably extend completely around the endless double loop track 445. FIGS. 9A and 9B do not show the container holders 457 or the container bodies 204.

The conveyor frame 439, shown in FIG. 10, includes a top plate 460, which extends substantially the length of the coating housing 409, and opposing side walls 463 extending downwardly from opposite longitudinal edges of the top plate and then outwardly to distal lower edges 466. The rail 454 runs along the lower edge of 466 of the side walls 463 to form the outer loop 448. Along the outer loop 448, the rail 454 is angled upwardly and inwardly to orient the container bodies to slightly upwardly and inwardly so that the sides of the container bodies face the coating vapor source 212. A pair of supports 469 extend horizontally and inwardly toward one another from opposite side walls 463 of the conveyor frame 439 proximate the top plate 460 of the conveyor frame. The conveyor rail 454 runs along these horizontal supports 469 to form the inner loop 451 of the endless double loop track 445. Along the inner loop 451, the rail 454 is oriented vertically so that the container bodies 204 are oriented substantially vertically with the bottoms of the container bodies facing the coating vapor source 212. A pair of plates 472 extend substantially horizontally between the top plate 460 and the supports 469 and have grooves 479 running longitudinally for providing stability to the container holders 457 as the holders ride along the inner loop 451.

A dust shield 478 is mounted to the conveyor frame 439 and extends from the conveyor frame along the side walls 463 of the conveyor frame, downwardly and outwardly to the side walls of the coating housing cylinder 410. This shielding 478 thus separates the container housing 409 into an upper compartment 482 and a lower compartment 483, the coating vapor 215 from the coating vapor source 212 being confined substantially to the lower compartment. The container holders 457 pass through a groove in the shielding as the container holders travel along the conveyor 209.

Each container holder 457 comprises an arm 484, a projection 487 extending from one end of the arm, a pair of spaced wheels 490 mounted to the arm adjacent the projection, and a magnetic container holder and container rotating mechanism 493 at an opposite end of the arm. The projection 487 travels through the grooves 475 in the horizontal support plates 472 of the conveyor frame 439. The spaced wheels 490 engage the endless rail 454 of the conveyor track 445. The magnetic container holder 493 includes a magnet which draws and holds the caps 312 placed on the threaded ends or fitments of the plastic container bodies 204. This magnetic force holds the container bodies 204 to the container holders 457 throughout the coating process. The holder 457 rotates the container bodies 204 constantly while conveying the container bodies through the container housing 409.

The entire conveyor 209 can be slid outwardly from the coating housing 409 by sliding the conveyor frame 439 along the rails 442 mounted to the coating housing after the coating housing has been retracted along the coating housing support track 424.

Evaporator System for Producing Coating Vapor

The coating vapor source 212 comprises four evaporators 510 in series along the length of the coating housing 409 beneath the conveyor 209. The evaporators 510 are mounted on an elongate hollow support beam 513. The support beam 513 is, in turn, mounted on rollers 516 on a track 519 running along the bottom of the coating housing 409. The evaporators 510 can thus be rolled out of the coating housing 409 when the coating housing is separated from the vacuum cell port 221. This makes the evaporators 510 accessible for repair and maintenance.

The evaporators 510 are similar to the evaporator 1 used in the previously described embodiment and illustrated in FIG. 1. The evaporators 510 in the high speed, high volume system 200 operate under substantially the same parameters as the evaporator 1 in the previously described embodiments. Each evaporator 510 includes a receptacle 524 containing a vaporizable material, said receptacle being constructed of a suitable material, for example carbon when evaporating silicon. Suitability of material for the receptacle 524 is primarily determined by ability to withstand the required temperature to melt and evaporate the coating material and by its inertness to the coating material. Each evaporator 510 includes a cold cathode 521 and the receptacle is electrically connected as an anode. The cathode 521 desirably comprises brass or magnesium, but also can be made of other components, preferably metals which are useful as the glass-forming metal additives which vaporize and form part of the inorganic oxide coating on the container bodies 204. Suitable additives are described hereinabove. The receptacle 524 is separately heated by appropriate means, such as inductive or resistance heating. FIG. 10 illustrates a power line 530 to the anode. The power line to the cathode 521 is not shown.

Each evaporator 510 includes a housing 533 containing the anode 524 and the vaporizable solid receptacle 527. In addition, the housing 533 contains a heater for heating the receptacle 527 to very high temperatures, 1200° to 1800° C. A suitable heater is a carbon felt resistance heater. Silicon, for example, is heated in a receptacle to a temperature of about 1500° C. The e gun or cold cathode 521 is positioned to further heat the vaporizable material in the receptacle 527 and create a plasma vapor which is emitted through an opening 538 in the housing. The resistance heater 536 is electrically powered through power lines 541 extending through the support beam 513.

A pivotedly mounted dust shield 544 is selectively positionable above the evaporators 510 to protect the evaporators from coating particles which do not adhere to the container bodies 204, and is alternatively positionable in a lower position exposing the evaporators.

The coating angle of the plasma vapor emitted by the evaporators 510 is desirably 30 to 60°, as described with the previous embodiment. The distance between the evaporators 510 and the container bodies 204 is desirably 0.5 to 2 m as with the previously described embodiment.

Operation of High Speed, High Volume Coating System

Generally described, the plastic container bodies 204 are coated with an inorganic oxide coating such as silica by feeding the container bodies automatically and continuously to the vacuum cell 206 with the container feeder 203, conveying the container bodies through the vacuum cell with the conveyor 209 over the coating vapor source 212 and withdrawing the coated container bodies from the vacuum cell with the container feeder.

More particularly, before the plastic container bodies 204 are coated with the high speed, high volume system 200, the evaporator receptacles 527 are loaded with a vaporizable material such as silicon and the air in the vacuum cell 206 is evacuated to a pressure of about $2\times10^{-4}$ mbar. Oxygen is fed into the vacuum cell 206 through appropriate gas inlets Uncoated plastic container bodies 204 are supplied to the container feeder 203 from a source 224 of container bodies such as a plastic container blow molding line. The uncoated container bodies 204 are conveyed by the first screw conveyor 230 to the first exterior rotary feeder 239 which transports the uncoated container bodies into individual ports 288 in the feed wheel 236 through the exterior opening 203 in the vacuum cell port 221. The ports 288 are evacuated as the uncoated container bodies 204 are transported by the feed wheel 236 to the first interior rotary feeder 242. The first interior rotary feeder 242 grasps the uncoated container bodies 204 and transports them to the conveyor 209.

The uncoated containers are capped with magnetic venting caps 312 with the capper 314. The caps 312 allow the container bodies to remain slightly pressurized in the high vacuum environment of the vacuum cell 206.

The container holders 457 carried by the conveyor 209 magnetically attach to the container body caps 312 and carry the container bodies back and forth four times through the coating housing 409 over the evaporators 510. The container holders 457 are vertically oriented when initially picking up the container bodies. The container holders 457 and the connected container bodies 204 become reoriented as the container holders 457 travel along the endless conveyor rail 454.

The silicon in the evaporator receptacles 527 is heated by the resistance heaters 536 and the evaporators 510 and the associated cold cathodes 521. This creates a plasma vapor comprising evaporated silicon and small amounts of evaporated metal additives such as zinc, copper, or magnesium, which are evaporated from the cold cathodes 521 themselves. As the container bodies 204 pass over the evaporators 510, the material in the plasma vapor deposits on the exterior surface of the container bodies and reacts with the oxygen in the coating housing 409 to form a thin, durable inorganic oxide coating on the exterior surface of the container bodies. The caps 312 on the threaded openings or fitments of the container bodies leave the threaded openings or fitments uncoated.

The conveyor rail 454 first carries the container bodies 204 on a first pass over the evaporators 510 with the sides of the container bodies facing the evaporators. The container holders 457 constantly rotate the container bodies 204 throughout the conveying and coating process. Next, the container holders 457 carry the container bodies 204 along one side of the inner loop 451 on the conveyor rail 454 on a second pass over the evaporators 510. On the second pass, the container holders 457 and container bodies 204 are vertically oriented with the bottom of the container bodies facing the evaporators 510 to coat the bottom of the container bodies. Next, the container holders 457 follow the conveyor rail 454 along the other side of the inner loop 451 on a third pass over the evaporators 510. Like the second pass, the container holders 457 and container bodies 204 are vertically oriented with the bottoms of the container bodies facing the evaporators 510. On the fourth and last pass over the evaporators 510, the container holders 457 follow the conveyor rail 454 along the other side of the outer loop 448. On this fourth pass, the conveyor rail 454 reorients the container holders 457 and the container bodies 204 so that the sides of the container bodies face the evaporators 510.

The coated container bodies 204 are then returned to the vertical position and grasped by the arms 383 of the second interior rotary feeder 245. The second interior rotary feeder 245 transports the coated container bodies 204 to the ports 288 in the rotating feed wheel 236. The feed wheel 236 transports the coated container bodies 204 to the second exterior container feeder 248 while air feed ports 3 11 repressurize the feed wheel ports 288. The second exterior rotary feeder 248 grasps the coated container bodies from the ports 288 of the feed wheel 236 through the exterior opening 300 and transport the coated container bodies 204 to the second screw conveyor 233 which conveys the coated container bodies towards the beverage packaging line 227.

The beverage packaging line 227 can be a conventional beverage filling and sealing process. The coated container bodies are first filled with a beverage and then sealed. The containers can be filled with a variety of beverages including alcoholic beverages such as beer and non-alcoholic beverages such as carbonated beverages, water, juices, sports drinks, and the like. The beverages can be sealed under pressure in the container. Carbonated beverages, for example, are sealed under pressure. The containers made according to this invention provide a barrier to carbon dioxide and therefore hold carbon dioxide within the carbonated beverage container.

RECYCLING

The coated containers of this invention described above are particularly suitable for recycling. This invention therefore encompasses a method for producing recycled content plastic comprising the steps of providing a batch plastic, at least a portion of the batch plastic comprising coated plastic containers, and converting the batch plastic to a form suitable for melt extrusion. The coated plastic containers for recycling comprise a plastic container body having an external surface and a coating on the external surface comprising an inorganic oxide. Two suitable recycling processes are described in more detail below.

Figure 15:
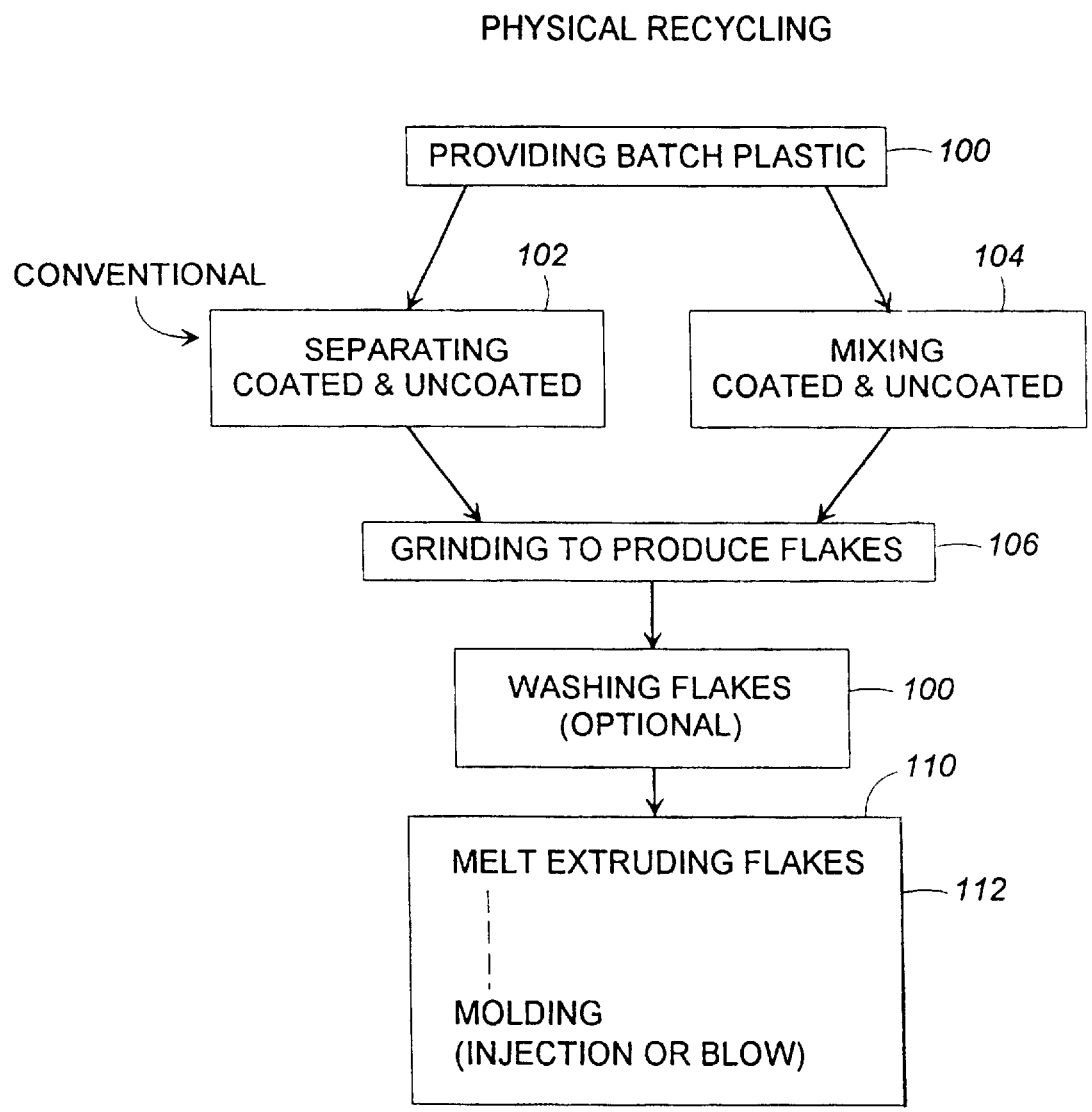
FIG. 15 is a flow chart illustrating the steps of physical recycling.

FIG. 15 is a flow chart illustrating a physical recycling process. In recycling, either physical recycling or chemical recycling are normally carried out for plastic containers. In physical recycling, a batch of plastic is provided as indicated in step 100. While this plastic can include a single type of item, it is contemplated that both coated and uncoated plastics will be provided. In a conventional process indicated in step 102, these coated and uncoated plastics must be separated. This can be a labor intensive step and will result in increased costs for recycling.

With the instant invention, this separating step 102 can be avoided. In particular, step 104 indicates mixing of coated and uncoated containers. While this step can certainly be done at the recycling station, it is contemplated that the actual mixing could take place prior to the arrival of the plastic at the recycling station. For example, when the plastic is picked-up by a refuse vehicle and taken to the recycling center, such mixing could then occur. An advantage of the instant invention is that when plastic to be recycled is mixed with coated plastic being with non-coated plastic, separation of these two plastics is unnecessary. In practice, this is, in fact, impracticable. Accordingly, when introducing coated containers into the recycling steam, the recycling process is unaffected.

As in a conventional process, the mixed plastics are ground into flakes in step 106. An optional step of washing the flakes 108 can be carried out. In fact, a washing step could occur at many other times during the process.

After the step of washing 108, if it is carried out, or after the step of grinding 106, the ground flakes are melt extruded at step 110. A step of forming 112 then occurs which merely indicates that something is done with the extrusion. For example, pellets, flakes or other configured plastics could be melt extruded and then blow molded or injection molded. Many other uses for the recycled plastic are possible. The blow molded or injection molded plastic can be reused for containers and in particular, can be used for beverage containers. In fact, the batch plastic initially provided in the method at step 100 can be plastic beverage containers whereby bottle-to-bottle recycling is possible. Of course, the type of plastic handle and the output of the recycling process is not limited.

Figure 16:
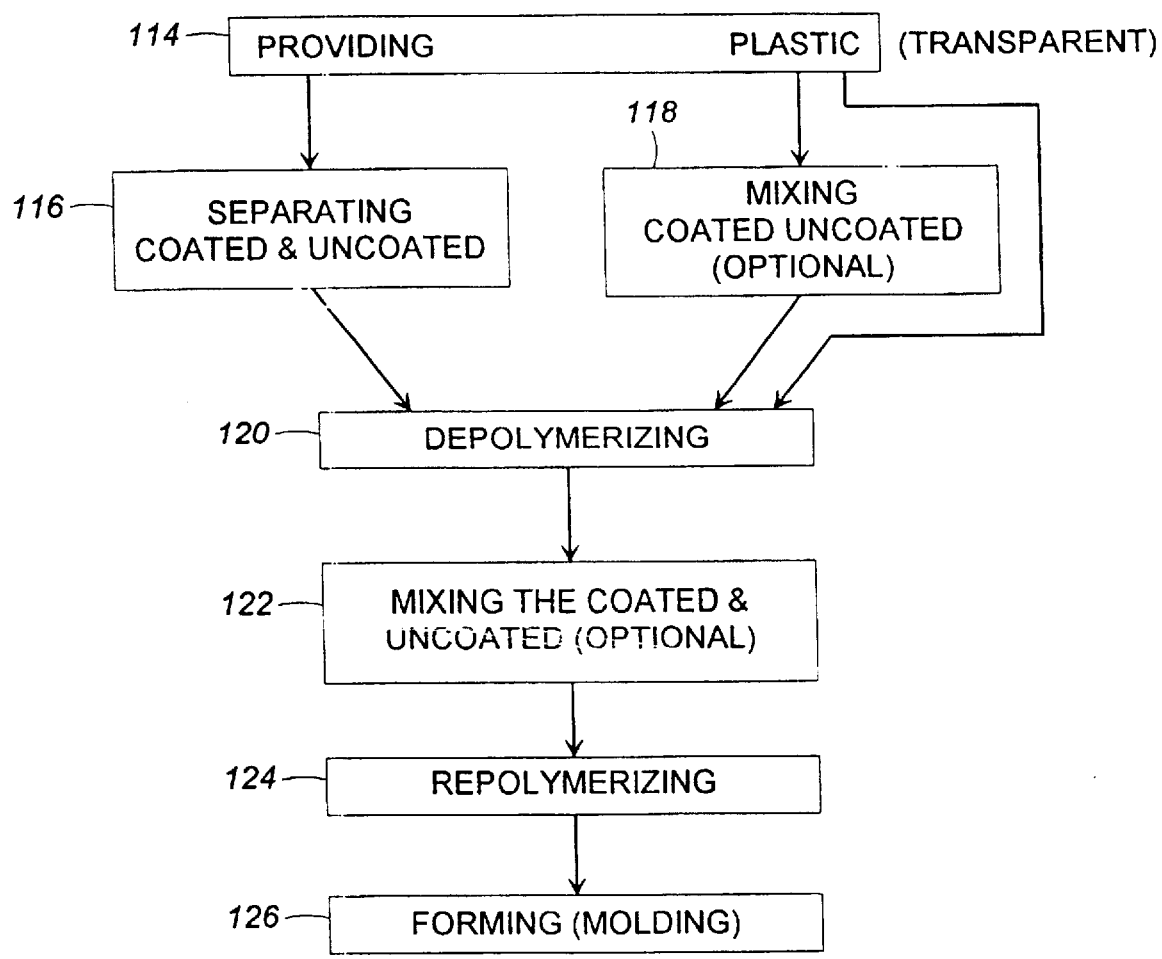
FIG. 16 is a flow chart illustrating the steps of chemical recycling.

Apart from the steps of physical recycling, the instant invention is also applicable to a chemical recycling process as shown in FIG. 16. Again, plastics are provided in a step 114. Conventionally, a separating step 116 was necessary. The instant invention avoids such a separating step 116. Similarly to the above-described physical recycling, a mixing step 118 for coated and uncoated plastic is indicated. This mixing can take place at the recycling station or prior to the plastic's arrival at this station.

In chemical recycling, the plastic is depolymerized by conventional processes as indicated in step 120. To indicate the flexibility of the instant invention, it is contemplated that separated coated and uncoated plastic could be provided in the step 114. These separate plastics would be separately depolymerized in step 120 but would be mixed together in step 122. This optional mixing step 122 is merely to indicate the flexibility of the instant invention.

After the plastic is depolymerized, it is repolymerized in step 124. This plastic can then be formed into a desired article such as by blow molding or extrusion molding as indicated in step 126. Similarly to the physical recycling process, the chemical recycling process can handle and produce many types of plastics. For example, bottle-to-bottle recycling is possible.

Another benefit to the recycling process of the instant invention is that haziness in the final recycled product is avoided. Because relatively small particles are used in the coating, a haze in the finally produced recycled product can be avoided. Moreover, the coating is acceptable for food contact and therefore will not adversely affect the recycling efforts when ground or depolymerized in the recycling processes.

The plastic produced in either recycling process can be injection molded or blow molded as noted above. Even if a coated plastic is initially introduced in the recycling process, the coating of the present invention will not interfere with the downstream injection molding or blow molding processes.

While the particular physical and chemical recycling have been discussed, it should be appreciated that the instant invention can also be applied in other types of recycling processes.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A system for making coated plastic containers each possessing a gas barrier and comprising a plastic container body and a thin coating, the system comprising:
    a vacuum cell capable of maintaining a vacuum within the vacuum cell;
    a container feeder for supplying the plastic container bodies into and withdrawing the coated plastic containers out from the vacuum cell, the plastic container bodies each having an external surface and an interior surface defining an interior space;
    a conveyor within the vacuum cell for conveying the plastic container bodies through the vacuum cell;
    at least one source disposed in the vacuum cell for supplying a coating vapor to the external surface of the plastic container bodies as the plastic container bodies are conveyed through the vacuum cell, the at least one source of coating vapor including an evaporator for heating and evaporating an inorganic coating material to form the coating vapor; and
    a gas feed for supplying at least one reactive gas to an interior of the vacuum cell;
    the at least one source of coating vapor and the conveyor structured and arranged within the vacuum cell such that (a) the coating vapor from the at least one source reacts with the reactive gas and deposits the thin coating on the external surface of the containers, (b) the thin coating comprises an inorganic compound and bonds to the external surface of the plastic container bodies, and (c) the resulting coated plastic containers, when containing a pressurized fluid sealed in the interior space at a pressure of 60 psig (4.1 bars), possess a gas barrier of at least 1.25× the gas barrier of the plastic container bodies without the thin coating, when the plastic container bodies without the coating contain a pressurized fluid sealed in the interior space at a pressure of 60 psig (4.1 bars).

2. The system for making coated plastic containers as in claim 1, wherein the reactive gas is selected from the group consisting of oxygen, nitrogen, sulfur and halogens.

3. The system for making coated plastic containers as in claim 1, wherein the reactive gas is oxygen and the inorganic compound is an inorganic oxide.

4. The system for making coated plastic containers as in claim 3, wherein the thin coating further comprises a glass-forming metal additive.

5. The system for making coated plastic containers as in claim 1, wherein, while the vacuum cell maintains a vacuum within the vacuum cell, the container feeder continuously feeds the plastic container bodies from outside the vacuum cell into the vacuum cell to the conveyor, the conveyor continuously conveys the plastic container bodies through the vacuum cell past the at least one source, and the container feeder continuously retrieves the coated plastic containers from the conveyor and withdraws the coated plastic containers from the vacuum cell.

6. The system for malking coated plastic containers as in claim 1, further comprising means for rotating the plastic container bodies while the plastic container bodies are conveyed through the vacuum cell.

7. The system for making coated plastic containers as in claim 4, wherein the plastic container bodies each have a bottom and sides and the conveyor is capable of orienting the plastic container bodies relative to the at least one source of coating vapor to coat both the bottom and sides of the plastic container bodies with the coating vapor.

8. The system for making coated plastic containers as in claim 1, further comprising a capper for sealing each plastic container body with a cap before the plastic container body is fed to the conveyor, wherein the conveyor comprises a plurality of arms for engaging the caps while the caps are on the plastic container bodies and carlying the plastic container bodies while the conveyor transports the plastic container bodies through the vacuum cell.

9. The system for making coated plastic containers as in claim 1, further including means for forming the coating vapor into a high-energy plasma.

10. The system for making coated plastic containers as in claim 1, wherein the at least one source of coating vapor comprises a receptacle electrically connected as an anode for containing at least a portion of the coating material and a cathode directed at the portion of the coating material in the receptacle for at least partially vaporizing the coating material and fomning the coating vapor into plasma.

11. The system for making coated plastic containers as in claim 10, wherein the cathode is vaporizable to form a portion of the coating vapor.

12. The system for making coated plastic containers as in claim 11, wherein the cathode comprises brass.

13. The system for making coated plastic containers as in claim 10, wherein the cathode comprises magnesium.

14. The system for making coated plastic containers as in claim 1, wherein the conveyor and the at least one source of coating vapor are strictured and arranged so that the coating vapor reacts on the external surfaces of the plastic container bodies with the reactive gas supplied by the gas feed to form the thin coating.

15. A system for making coated plastic containers possessing a gas barrier, the system comprising:

a vacuum cell capable of maintaining a vacuum within the vacuum cell;

a container feeder for supplying the plastic container bodies into and withdrawing coated plastic containers out from the vacuum cell, the plastic container bodies each having an external surface and an interior surface defining an interior space;

a conveyor within the vacuum cell for conveying the plastic container bodies through the vacuum cell; and at least one source disposed in the vacuum cell for supplying a coating vapor to the external surface of the plastic container bodies as the plastic container bodies are conveyed through the vacuum cell, the at least one source of coating vapor including an evaporator for heating and evaporating a metal coating material to form the coating vapor;

the at least one source of coating vapor and the conveyor stntctured and arranged within the vacuum cell such that the coating vapor from the at least one source deposits a thin coating on the external surface of the plastic container bodies, the thin coating comprises a metal and bonds to the external surface of the plastic container bodies, and the resulting coated plastic containers, when containing a pressurized fluid sealed in the interior space at a pressure of 60 psig (4.1 bars), possess a gas barrier of at least 1.25× the gas barrier of the plastic container bodies without the coating, when the plastic container bodies without the coating contain a pressurized fluid sealed in the interior space at a pressure of 60 psig (4.1 bars).

16. The system for making coated plastic containers as in claim 15, wherein the at least one source of coating vapor comprises a receptacle electrically connected as an anode for containing at least a portion of the metal coating material and a cathode directed at the portion of the metal coating material in the receptacle for at least partially vaporizing the metal coating material and forming the coating vapor into plasma.

* * * * *